United States Patent [19]
Topolewski et al.

[11] Patent Number: 5,448,493
[45] Date of Patent: Sep. 5, 1995

[54] STRUCTURE AND METHOD FOR MANUALLY CONTROLLING AUTOMATIC CONFIGURATION IN AN INTEGRATED CIRCUIT LOGIC BLOCK ARRAY

[75] Inventors: Todd J. Topolewski, Oakland; Christine M. Weir, Santa Cruz; Bart Reynolds, Campbell; Julia M. Smuts, San Jose; Pardner Wynn, San Jose; Stephen M. Trimberger, San Jose, all of Calif.

[73] Assignee: Xilinx, Inc., San Jose, Calif.

[21] Appl. No.: 456,010

[22] Filed: Dec. 20, 1989

[51] Int. Cl.⁶ .............................. G06F 15/60
[52] U.S. Cl. ..................... 364/489; 364/488
[58] Field of Search ............... 364/488, 489, 490, 491; 307/465; 340/825.83

[56] References Cited

U.S. PATENT DOCUMENTS

| | | | |
|---|---|---|---|
| 3,617,714 | 11/1971 | Kernighan et al. | 364/489 |
| 4,001,601 | 1/1977 | Schuster | 307/449 |
| 4,700,187 | 10/1987 | Furtek | 307/465 |
| 4,786,904 | 11/1988 | Graham, III et al. | 364/488 |
| 4,864,381 | 9/1989 | Seefeldt et al. | 364/491 |
| 4,890,238 | 12/1989 | Klein et al. | 364/491 |
| 4,896,272 | 1/1990 | Kurosawa | 364/491 |
| 4,922,432 | 5/1990 | Kobayashi et al. | 364/489 |
| 4,967,367 | 10/1990 | Piednoir | 364/490 |
| 4,978,633 | 12/1990 | Seefeldt et al. | 364/491 |
| 5,015,885 | 5/1991 | El Gamal et al. | 307/465 |

OTHER PUBLICATIONS

"Partitioning and Placement Technique for CMOS Gate Arrays" by Odawara et al., IEEE Trans. on Computer-Aided Design of Integrated Circuits and Systems CAD-6, No. 3, May 1987, pp. 355-363.
"An Efficient Heuristic Procedure for Partitioning Graphs" by Kernigham et al., The Bell Systems Technical Journal, Feb. 1970, pp. 291-307.
"Design with Logic Cell Arrays" by Pardner Wynn, Xilinx Inc., 19/4, pp. 1-9.
"Reconfigurable Architecture for VLSI Processing Arrays" by Sami et al., Proceedings of IEEE, vol. 74, No. 5, May 1986, pp. 712-722.
"Optimization by Simulated Annealing", Kirkpatrick, et al., *Science*, vol. 220, pp. 671-680, 13 Mar. 1983.

*Primary Examiner*—Vincent N. Trans
*Attorney, Agent, or Firm*—Edel M. Young; Norman R. Klivans

[57] ABSTRACT

Highly integrated programmable arrays, in which a logic array integrated circuit chip is divided into configurable logic blocks interconnected by configurable interconnect lines, have been programmed by automatic means and methods. The present invention provides for allowing a user to manually specify the partitioning of a logic design, and to allow a user to retain portions of a previously partitioned, placed, and routed design when making revisions. To allow for manual control of partitioning, a library of symbols includes a partitioning symbol that specifies which primitive logic functions can be grouped. The user specifies which ports of primitive logic functions will correspond with ports on the logic block symbol. The present invention also allows for partitioning parts of a design before combining the parts.

32 Claims, 12 Drawing Sheets

LOGIC CELL ARRAY STRUCTURE
(PRIOR ART)

=  i. e. no possible connection

=  or  (can be connected or disconnected)

= Full interchange - e. g. Figure 2d

= Full interchange - e. g. Figure 2c

= Partial interchange:  or  or  or  or

= Bidirectional amplifier (buffer)

Lines not having  or  intersections are long lines intended to be low skew paths, for example clock paths.

Circled numbers on the ends of each pass transistor
indicate which paths are connected by that pass transistor.

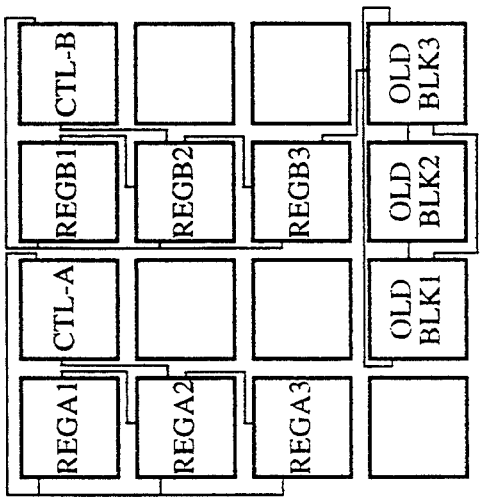
FIG. 8c
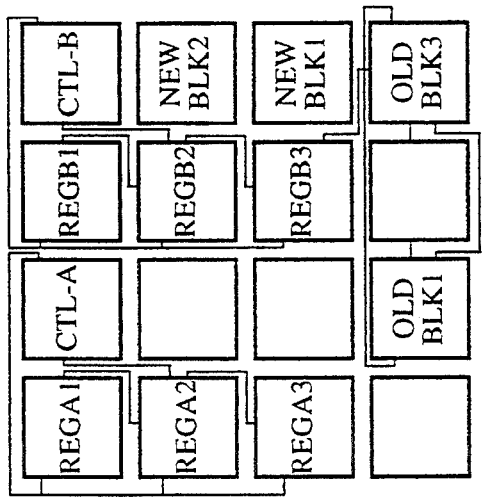
FIG. 8f
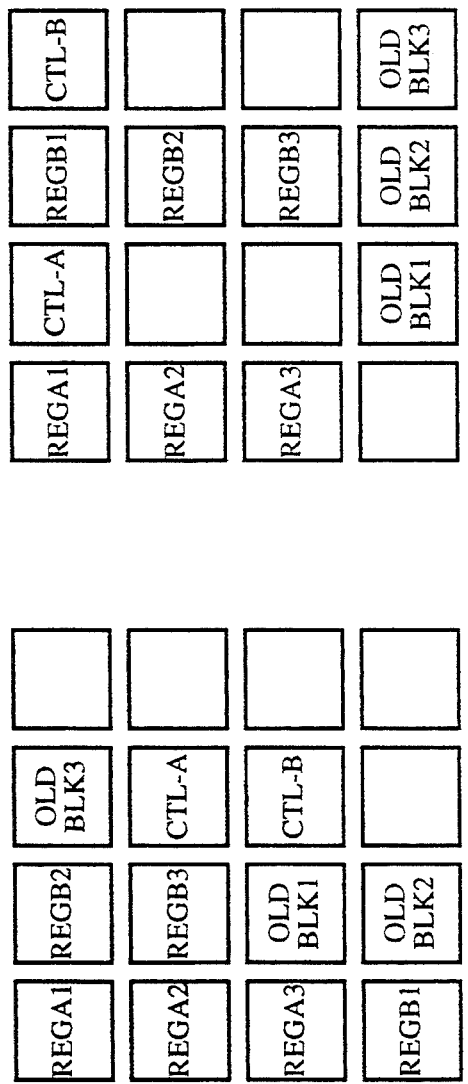
FIG. 8b
FIG. 8a
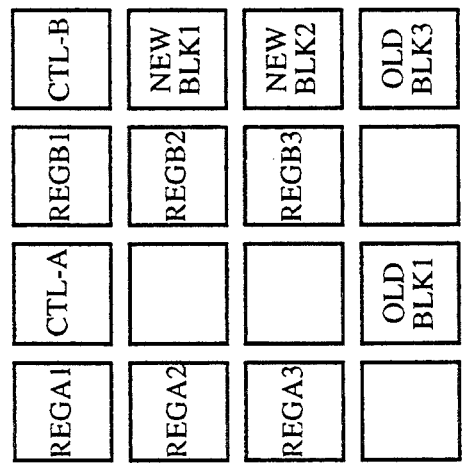
FIG. 8e
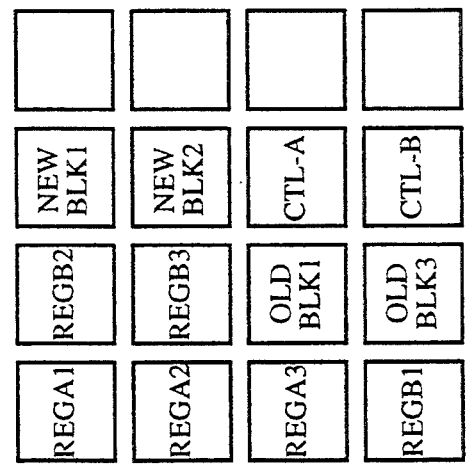
FIG. 8d

STRUCTURE AND METHOD FOR MANUALLY CONTROLLING AUTOMATIC CONFIGURATION IN AN INTEGRATED CIRCUIT LOGIC BLOCK ARRAY

CROSS REFERENCE TO MICROFICHE APPENDICES

Three microfiche appendices are provided as part of this disclosure on eight sheets of microfiche. Appendix 1 consists of 385 frames, Appendix 2 consists of 11 frames, and Appendix 3 consists of 102 frames. These appendices contain material which is subject to copyright protection. The copyright owner has no objection to the facsimile reproduction by anyone of the patent document or of the microfiche appendices as they appear in the Patent and Trademark Office patent files or records, but otherwise reserves all copyright rights whatsoever (1077 OG 22).

FIELD OF THE INVENTION

This invention relates to means and methods of defining custom logic functions in a user-programmable integrated circuit. In particular, this invention relates to a method of partitioning a very complex logic function into simpler logic functions and of retaining desired portions of an existing design in an updated circuit.

BACKGROUND

As it has become possible to perform more simple basic logic functions (i.e., AND, OR, NOT, FLIP FLOP, etc.) within a single integrated circuit chip, manufacturers of integrated circuit chips have developed ways of automatically and quickly defining in custom chips, specific functions for specific applications. "Gate array" manufacturers apply custom metallization layers as a final step in a standard manufacturing process in order to connect transistors located within a semiconductor substrate one to the next to perform a particular logic function requested by a customer. For customers who make frequent design changes, who want only small numbers of identical devices, or who may not have fully tested a new design, so-called "user programmable" integrated circuit chips are available. In a user programmable device such as disclosed in U.S. Pat. No. 4,870,302 assigned to Xilinx, Inc., and incorporated herein by reference, there are many pass transistors which can be programmably turned on or off (conductive or nonconductive) to programmably connect or not connect input/output lines of logic blocks to input/output lines of other logic blocks, to connect input/output lines of logic blocks to pins of the IC package, and to connect pins of the IC package to each other. By turning on the proper combination of pass transistors and connecting the proper set of lines a designer can obtain a desired "complex" logic function having the interconnected basic logic functions as its constituents. The designer can reprogram a different design into the chip by turning on different combinations of pass transistors.

As the number of transistors on a single integrated circuit chip has increased and the complexity of logic functions desired by designers has also increased, it has become common to use computer aided design (CAD) to determine the layout necessary to achieve a desired complex logic function. For gate arrays with metal interconnects, automatic placement and routing methods translate a designer's schematic diagram or set of logic equations to a list of metal lines to be formed above the gate array substrate. The list of lines is in turn translated into a mask for physically locating the lines on the chip. For a programmable logic array, automatic placement and routing methods translate the schematic diagram or set of logic equations to a list of pass transistors to be turned on, thereby connecting certain of the metal lines to each other and to combinatorial logic gates to perform the desired logic function (each gate being a group of transistors preconnected to perform a simple logic function such as AND, OR).

Xilinx, Inc., the assignee of the present invention, manufactures logic block arrays (or logic cell arrays) having a higher level of integration than typical programmable logic arrays. A Xilinx logic block array includes an array of logic blocks, each of which can be configured to perform a desired moderately complex logic function (each logic block combining several AND, OR, MUX and FLIP-FLOP gates, for example). The Xilinx logic block array chip also includes interconnect lines which can be programmed to connect individual logic blocks to achieve one or more complex logic functions to be provided by the entire chip. In current Xilinx products, two kinds of configurable blocks are used in a logic block array chip. The chip contains, near its perimeter, input/output logic blocks which can be programmed to connect input buffers or output buffers to the external pins of the chip and to perform some logic functions such as invert. In the interior of the chip are logic blocks which do not offer the input/output buffer option but offer more logic functions within a single block. Other blocks provide clock buffers, pull-up resistors and other functions.

FIG. 1 is a top view schematic showing a corner portion 10 of one of the logic block array chips for which automatic programming is available. The logic array chip of FIG. 1 includes three kinds of logic blocks. Configurable input/output blocks IO1 through IO15 are shown. Configurable logic blocks CLB11–CLB14, CLB21–CLB24, CLB31–CLB34 and CLB41–CLB44 are shown. Each of the configurable input/output and logic blocks includes within it a plurality of combinatorial logic gates such as AND, OR, XOR, INVERT, TRISTATE, FLIPFLOP and MUX which can be configured to perform a plurality of moderately complex logic functions. The CLB's are more fully described in U.S. Pat. No. 4,706,216, incorporated herein by reference. Also shown in FIG. 1 is clock signal buffer block CLK which is connected to receive an external clock signal and buffer this signal for applying as desired to logic blocks or I/O blocks. Additional types of functional blocks not shown in FIG. 1 are typically provided, for example, blocks of pull-up resistors and three-state buffers which allow an interconnect line to operate as a wired AND or wired OR element.

The internal components of a logic block can perform multiple simple-level functions, some of which are selected when the block is configured. In the Xilinx XC3000 Logic Cell Array Family, for example, a logic block (CLB) such as shown in FIG. 3b includes a combinatorial logic function component 354 which can provide any logic function of up to five input variables, or two functions of up to four input variables each. When a component such as CLB21 of FIG. 1 is programmed, a 32-bit look-up table (not shown) is loaded into the block to be addressed by the input variables a–e (FIG. 3b) during operation. This look-up table is very fast, therefore the signal delay caused by the combinatorial function component 354 is minimal in spite of the flexibility and complexity of the logic block. Because signals internal to a CLB are processed much more rapidly than those which must pass between different CLB's or IOB's of the logic array, it is desirable to group related logic (logic elements connected to a common point) into the same logic block (CLB).

Configurable blocks each have input and output leads for receiving input signals and providing output signals. These leads are shown in FIG. 1 as short lines extending outward from each of the blocks and not connected to other portions of the array. These configurable blocks also have configuration leads for programming the complete logic function of the logic array. The configuration leads of each block determine on which of the other (non-configuration) leads input and output signals will appear, and what logic function will be applied by the block to signals entered on its input leads to generate a signal placed by the block on its output lead or leads.

FIG. 2a shows in more detail a smaller portion of a logic cell array chip with the interconnect lines for connecting one configurable logic block (CLB) or input/output block (IOB) to another CLB or IOB. Some of the interconnect lines are short segments which extend only a short part of the distance across the entire array, and others typically extend in one dimension for the entire length or width of the array. FIG. 2b is a legend showing meanings for the marks in FIG. 2a. FIGS. 2c and 2d show the arrangement of pass transistors for two marks in FIG. 2a. For example, diagonal lines indicate programmable pass transistors for connecting horizontal lines to vertical lines. Each transistor at a diagonal line will have one current carrying terminal connected to a horizontal line and one to a vertical line. The control terminal of the transistor is not shown in FIG. 2a but is connected to a memory cell into which a zero or one is entered when the array is being configured. The zero or one in the memory cell causes the horizontal line to be connected or not connected to the vertical line. As shown in FIGS. 2c and 2d, transistors are also placed at ends of adjacent segmented lines to control the continuity between segments. Each of these transistors is also controlled by a memory cell. A set of memory cells thus controls the configuration of the interconnect lines interconnecting the logic blocks in the array. FIGS. 2a–2d are discussed more fully in U.S. Pat. No. 4,870,302 incorporated herein by reference.

FIG. 3a shows one configurable input/output block (IOB) in an array of IOBs such as IOBs 1–15 shown in FIG. 1 and IOBs 40-11 through 40-15 shown in FIG. 2. Some of the configuration control means are shown in FIG. 3a, for example program-controlled memory cells 311–315 which may invert, multiplex or select a signal. Tri-statable output buffer 321 has its slew rate controlled by slew rate memory cell 314. Some control means in FIG. 3a are not shown, for example the means of controlling TTL/CMOS threshold buffer 324 to respond to a TTL or CMOS voltage level applied to pad 325. The IOB of FIG. 3a can be controlled to receive input signals on I/O pad 325 by turning off output buffer 321, and appropriately setting TTL/CMOS threshold buffer 324. The signal from I/O pad 325 buffered by buffer 324 is available directly on line 344 or as a registered input signal through D-flipflop 323 on line 345. If a registered input signal is desired, the control clock signal on line 348 may be taken from the CK1 line (an internal on-chip clock) by turning on interconnect transistor 327, or from the CK2 line (an external off-chip clock) by turning on interconnect transistor 329. Thus it can be seen that the IOB of FIG. 3a can be configured to perform many different functions.

Similarly, FIG. 3b shows the architecture of one possible configurable logic block (CLB) which can be configured to perform many different logic functions. FIG. 3b shows combinatorial function generator 354 having input lines 381–385 for receiving logic block inputs a–e and input lines 367 and 380 for receiving output signals from D-flipflops 352 and 357 respectively. Combinatorial function generator 354 also provides two combinatorial output functions F and G on lines 374 and 378, each of which may serve as input to either or both flipflops 352 and 357. Output functions F and G may also be provided as logic block output signals X and Y respectively on lines 395 and 396. Which functions are actually implemented by the logic block of FIG. 3b depends upon the settings of configuration control lines not shown in FIG. 3b. Combinatorial function generator 354 can generate any combinatorial function of five variables, or can generate two functions of four variables each. The operation of the logic block of FIG. 3b is described more thoroughly in the Xilinx "Programmable Gate Array Data Book" available from Xilinx, Inc, 2100 Logic Drive, San Jose, Calif. 95124.

A logic array including configurable blocks such as shown in FIGS. 3a and 3b and interconnect lines such as shown in FIG. 2a can be configured to perform a multiplicity of complex logic functions. A logic array is frequently programmed to perform a user-generated complex function represented by a schematic of circuit elements and combinatorial logic gates or by a linked group of Boolean equations.

To assist the designer in converting from an initial schematic design or group of Boolean equations, a set of partitioning, placement, and routing computer programs receives the initial designer information and generates a binary bit stream which is loaded into the logic array and controls all the pass transistors in the entire logic array. Xilinx provides programs specifically tailored for corresponding Xilinx logic array chips.

Major Steps in Configuring a Logic Array Chip

The Xilinx process comprises three major steps: partitioning, placement, and routing. At the partitioning step, the process divides the designer's complex logic function into smaller units, each of which can be implemented by a single CLB or IOB of the intended Xilinx logic array chip. At the placement step, the Xilinx process physically locates (places) each smaller unit in a particular one of the CLBs or IOBs. The routing step determines which interconnect lines to connect between the logic blocks to implement the designer's overall complex logic function.

The partitioning step includes determining how the logic block (CLB or IOB) into which a portion of the schematic is placed will be configured to perform the logic function indicated by that portion of the schematic. Thus the Xilinx method performs sequential steps of partitioning the overall logic function into smaller units (each of the smaller units of logic being performed in a CLB or IOB), placement of these smaller units into specific logic blocks, and routing the interconnect lines between logic blocks.

From files describing the partitioned, placed and routed design, a further step generates the bit stream which, in the subsequent actual programming step, is entered into memory cells for controlling the programmable transistors of the logic cell array chip.

Prior Art Partitioning

FIG. 4 shows steps used by the prior art Xilinx method for partitioning, placing, and routing a designer's initial design into a Xilinx logic cell array. As shown in FIG. 4, the designer started with his original design which may be entered in several ways (i.e. graphic or textual) and may have included several parts.

As shown on the upper left side of FIG. 4, the designer could enter a design using a schematic capture package 412. This capture package 412 could access symbol library 411, which included a symbol library 411 having common logic symbols (AND, NOR, FLIP-FLOP, INV, etc.) and additionally logic block symbols for which the designer could specify the contents. Using schematic capture package 412, the designer produced a schematic drawing 413 which incorporated symbols from library 411, connected as specified by the designer. Several schematic capture packages are commercially available, including for example, "Dash-LCA" available from Xilinx, Inc., 2100 Logic Drive, San Jose, Calif. 95124, "Schema II" available from Xilinx or from Omation, Inc., 801 Presidential Rd., Richardson, Tex. 75081, and "Orcad" available from Orcad Systems, 1049 S.W. Baseline St., Suite 500, Hillsboro, Oreg. 97123.

During this process the designer was able to assign to the combinatorial logic gates and to the lines connecting the gates, "attributes" to be used later such as block name, block location (essential for indicating placement of I/O blocks to be used with existing printed circuit boards), and lines to be kept explicitly exterior to a logic block. By assigning the same "block name attribute" to two different flipflops, the designer could specify that the two flipflops would be assigned to the same logic block. In the prior art partitioning, however, the designer was not able to assign block names to logic gates. The designer could assign an "explicitly external attribute" to a connecting line to prevent this line from being placed inside a logic block. Also, the designer could assign a "clock attribute" to the clock lead of a flipflop to specify that clock lead would be routed to one of two internal clock leads, external clock leads, or to the output of an internal gate in a logic block.

The designer could also specify partitioning by using the special logic block symbols in library 411, discussed above, and specifying the contents of the logic block for which the logic block symbol is used.

Schematic input. As an example, suppose a designer intended to implement a schematic diagram shown in FIG. 5a. Each of the signal lines, combinatorial logic gates, and input/output pads has been given a name by the designer.

After the designer entered the diagram using a schematic capture package 412, the package produced, from the diagram, a schematic drawing 413. Then Xilinx computer program 414 took the designer data of the drawing 413 and created a standard file 415. We call this file an XNF file, which stands for Xilinx external netlist file. A computer program 414 used a library of translations for each of the symbols in schematic drawing 413. Schematic-2XNF programs as represented in block 414 were and are available from Xilinx, Inc. for each of the schematic editors DASH-LCA, Schema II, and Orcad mentioned above. XNF file 415 listed the logic operations performed by each combinatorial logic gate and flipflop and the signal lines that combinatorial logic gate was connected to in drawing 413. XNF file entries for gates and1_out, or1_out, or2_out, xor1_out and two flipflops would read as follows:

TABLE 1

| XNF File Entries |
| --- |
| SYM, and1_out, AND |
| PIN, O, O, and1_out, |
| PIN, 2, I, and1_2, |
| PIN, 1, I, and1_1, |
| END |
| SYM, or1_out, OR |
| PIN, O, O or1_out, |
| PIN, 2, I, or1_2, |
| PIN, 1, I, and1_out, |
| END |
| SYM, xor1_out, XOR |
| PIN, O, O, xor1_out, |
| PIN, 2, I, xor1_2, |
| PIN, 1, I, xor1_1, |
| END |
| SYM, q1out, DFF |
| PIN, Q, O, q1out, |
| PIN, D, I, or1_out, |
| PIN, C, I, clk_out, |
| END |
| SYM, q2out, DFF |
| PIN, Q, O, q2out, |
| PIN, D, I, xor1_out, |
| PIN, C, I, clkout, |
| END |
| SYM, or2_out, OR |
| PIN, O, O or2_out, |
| PIN, 2, I, q2out, |
| PIN, 1, I, q1out, |
| END |

The first line begins with the word SYM to indicate a logic symbol will be presented. Next follows a name of the combinatorial logic gate. Next follows the logic function, which must be among the functions recognized by the program. In the first line of Table 1, an AND gate is indicated. On the second line, the word PIN indicates that information about input pins, output pins, or control pins will be presented. An AND gate has only input and output pins and they are designated "I" and "O" respectively. The second line above indicates that pin O of the named AND gate will be an output pin and it will be connected to line "and1_out". The third line indicates another pin will be specified, pin 2, which is an input pin, and it will be connected to line "and1_2". The fourth line indicates that pin 1 is also an input pin and it will be connected to line "and1_1". This information completely specifies the connections of a two-input AND gate, therefore the next line "END" indicates the information for that gate is complete. The next entry indicates the combinatorial logic gate used is an OR gate, with connections specified similarly. Connections for the third gate, an exclusive-or gate, are also similarly specified. The fourth entry is indicated to be a D-flipflop (DFF), and subsequent lines specify connections to, respectively, the output pin Q, the data-in pin D, and the clock pin C of the flipflop. No connection to the reset pin of the flipflop is shown. This means that the reset pin is not used. (Therefore no data on the reset pin is provided. The bit stream which controls all pass transistors in the array will disable this reset pin.) Again, "END" indicates information for the flipflop is complete. There would be such entries in the XNF file for every logic gate in the design.

Boolean Input. Alternatively, as shown on the right side of FIG. 4, the designer could type with text editor 416 the Boolean equations of a portion of his design.

These Boolean equations would be processed with PALASM program 417 and PDS2XNF program 418 to form XNF file 419. If both schematic and Boolean input are used, XNF file 419 would be merged with XNF file 415 to create a single XNF file 421. XNF file 421 listed conventional logic gates.

There may have been several XNF files if the designer supplied data in more than one format or if the designer designed his system in parts. As indicated in FIG. 4 by XNF merge step 420, the Xilinx program 420 took the separate XNF files and merged them to form a single XNF file 421 comprising the entire information for programming the logic array chip.

The Partitioning Step. As shown in FIG. 4, after merging separate files, the program took XNF file 421 and converted it to a partitioned LCA design file 426 in XNF2LCA step 422. While the XNF file had entries corresponding to each logic gate in the designer's schematic (as shown in Table 1, above), the LCA file 426 had entries corresponding to each logic block in the array.

An algorithm used by one partitioning program performed several steps to partition the designer's schematic into blocks of the logic array chip. The first step was to create groups of combinatorial logic that would source a non-combinatorial gate (i.e., flipflop or output buffer). Working backwards through the network from the source signal of the chosen non-combinatorial gate, the algorithm would gather gates into the group as it followed the gate input signal paths until it encountered a stop condition. In one embodiment, the stop condition included encountering another non-combinatorial gate, encountering a gate which is already assigned to a group, or encountering a point specified by the designer to be outside any logic block. These groups would eventually become the combinatorial logic functions in the configurable logic blocks. This grouping step might result in a group larger than would fit into a logic block.

If so, the partitioning program would reduce the size of the large group to fit into one logic block. Starting with the combinatorial gate which provided the input signal to the non-combinatorial logic gate (flipflop, IO buffer, 3-state buffer, for example), the program would inspect every smaller combination of gates which would fit into the logic block and which sourced the non-combinatorial gate. The program would select the combination which best met the criteria for an optimal group. This set of criteria included preferring
- a group with a maximum number of internal signals specified by the designer as 'critical',
- a group which reduced the total number of groups resulting from the leftover gates, and
- a group which would use more internal feedback signals, a greater number of gates, fewer input signals, and fewer signals specified by the designer as 'non-critical'.

When the first optimal group was determined, the program would make a new logic group for each signal which sourced the new optimal group. This group-reduction process would be applied to the new groups if necessary. The optimum group for sourcing the data input pin of a flipflop was then bound to that flipflop so that the flipflop and source group would be treated as a unit.

The next step was to determine which combinatorial logic groups and flipflop/source group units should be placed in the same configurable logic block. Each possible pairing was examined for how many input signals could be shared. By working from the highest to the lowest signal-sharing number, the algorithm would place pairs of flipflop/source group units and combinatorial logic groups into single configurable logic blocks. If two possible pairings would result in the same number of shared signals, the program would choose the pairing that had the highest degree of affinity between the groups or flipflops. Affinity measures how many signals would be shared if the groups were extended at their input ends to include an additional level of logic gates.

FIG. 5a shows a relatively small schematic diagram for which the prior art partitioning, placement and routing will be described. In the example of FIG. 5a, the prior art program of FIG. 4 partitioned the schematic into blocks shown in FIG. 5b. The blocks used are named AA, AB, and P2 through P9. Tables 2 and 3 show the contents of two parts of an LCA file generated by this prior art program to define the partitioned blocks of FIG. 5a.

TABLE 2

| LCA FILE (part 1) |
| --- |
| 1 Addnet xor1_2 AB.A P5.I |
| 2 Addnet xor1_1 AB.D P6.I |
| 3 Addnet q2out AA.A AB.X |
| 4 Addnet q1out AA.B AB.Y P3.O |
| 5 Addnet or2_out AA.X P2.O |
| 6 Addnet or1_2 AB.B P7.I |
| 7 Addnet clkout AB.K GCLK.0 |
| 8 Addnet clkin P4.I GCLK.I |
| 9 Addnet and1_2 AB.C P8.I |
| 10 Addnet and1_1 AB.E P9.I |
| 11 Nameblk AA or2_out |
| 12 Editblk AA |
| 13 BASE FG |
| 14 CONFIG X:F Y: RSTDIR: ENCLK: DX: DY: CLK: F:A:B |
| 15 EQUATE F=(A+B) |
| 16 Endblk |
| 17 Nameblk AB q2out |
| 18 Editblk AB |
| 19 BASE FG |
| 20 CONFIG X:QX Y:QY RSTDIR: ENCLK: DX:F DY:G CLK:K F:A:D G:B:C:E |
| 21 EQUATE G=(B+(C*E)) |
| 22 EQUATE F=(A@D) |
| 23 Endblk |

The first ten lines of Table 2, which begin with the word "Addnet" identify interconnect network lines to be connected (added) between blocks. The first line indicates that a signal line, named "xor1_2", is to be connected between block "AB", port "A" and block "P5", port "I". Subsequent Addnet lines similarly specify interconnect lines between blocks. Next, the internal configuration of each block is specified. Line 11 names block "AA" as "or2_out". Line 12 indicates that the block configuration will be specified (edited) in the lines following. Line 13 indicates that the block is configured as an "FG" block having two outputs which are separate functions of up to 4 variables each, as shown in FIG. 3b. Line 14 indicates the configuration of the "FG" block. The "F" following the "X:" indicates that on the "X" output port (see FIG. 3b) is placed function "F". The space following the "Y:" indicated no function is placed on the "Y" output port. The spaces following the next five colons indicated than these ports will also not be used. DX stands for the data port of the X flipflop 352, DY for the data port of the Y flipflop 357. Labels in FIG. 3b have the following correspondence to labels in Table 2: RSTDIR=RESET, ENCLK=ENABLE CLOCK, CLK=CLOCK. The entry "F:A:B" indicates that the F combinatorial logic function (function 354 of FIG. 3b) will use inputs A and B. Line 15 specifies the particular function F=A+B, meaning that F is to provide the function F=A OR B. In line 16, "Endblk" indicates the configuration of block AA is complete. As shown in FIG. 5b, the function performed by block AB is more complex than that of block AA. Therefore in line 20 of Table 2 the configuration statement for block AB is more complex. Outputs are specified for both the X and Y output ports. The entry "DX:F" indicates the data port of the X flipflop 352 is to receive the F function. Likewise, "DY:G" indicates the data port of the Y flipflop 357 is to receive the G function. The entry "CLK:K" indicates the K port of the block (FIG. 3b, line 388) is to be connected to the CLK ports of the flipflops (as controlled by MUX 360 in FIG. 3b). The next two entries on line 20 of Table 2 indicate that F is to be a function of A and D, and that G is to be a function of B, C, and E. Line 21 specifies that G is B OR (C AND E). Line 22 specifies that F is A XOR D.

Line 25 in Table 3, below, begins configuration of the input/output blocks. Five lines describe each input/output block. The block is first named. The next line indicates that its contents will be specified by the lines following in the table. The next line indicates the kind of block to use is an I/O block, as shown in FIG. 3a. The next line indicates the configuration of the block. In line 28 of Table 3 the entry "IN:I" indicates that block P9 is to be configured to provide the signal from I/O pad 325 on the input port (line 344 in FIG. 3a). The entry "OUT:" indicates that no signal on output port 336 will be provided, and the entry "TRI:" indicates that output buffer 321 will always be enabled. The blocks P3 through P9 are similarly configured in the following lines of Table 3, the last two blocks being configured to provide output from the logic cell array.

TABLE 3

| LCA FILE (part 2) |
| --- |
| 25 Nameblk P9 in1 |
| 26 Editblk Pq |
| 27 BASE IO |
| 28 CONFIG IN:I OUT: TRI: |
| 29 Endblk |
| 30 Nameblk P8 in2 |
| 31 Editblk P8 |
| 32 BASE IO |
| 33 CONFIG IN:I OUT: TRI: |
| 34 Endblk |
| 35 Nameblk P7 in3 |
| 36 Editblk P7 |
| 37 BASE IO |
| 38 CONFIG IN:I OUT: TRI: |
| 39 Endblk |
| 40 Nameblk P6 in4 |
| 41 Editblk P6 |
| 42 BASE IO |
| 43 CONFIG IN:I OUT: TRI: |
| 44 Endblk |
| 45 Nameblk P5 in5 |
| 46 Editblk P5 |
| 47 BASE IO |
| 48 CONFIG IN:I OUT: TRI: |
| 49 Endblk |
| 50 Nameblk P4 in6 |
| 51 Editblk P4 |
| 52 BASE IO |
| 53 CONFIG IN:I OUT: TRI: |
| 54 Endblk |
| 55 Nameblk P3 out1 |
| 56 Editblk P3 |
| 57 BASE IO |
| 58 CONFIG IN: OUT:O TRI: |

TABLE 3-continued

| LCA FILE (part 2) |
| --- |
| 59 Endblk |
| 60 Nameblk P2 out2 |
| 61 Editblk P2 |
| 62 BASE IO |
| 63 CONFIG IN: OUT:O TRI: |
| 64 Endblk |

A designer might have preferred that the partitioning into blocks be performed differently, for example, that OR gate "or2_out" and flipflop "Q2OUT" be located in the same block, and that flipflop "Q1OUT" be located in a separate block.

One way to accomplish this with the prior art program was to use logic block symbols provided by special Xilinx library of symbols 411 for the schematic capture program 412. For each logic block described by such a logic block symbol, the designer had to type into the computer the block configuration equivalent to lines 11–23 of Table 2. Designers objected to this method because the typing was error-prone and tedious and because the use of the logic block symbols made simulation of their design by logic simulators impossible with existing software.

The prior art method and structure did allow some less tedious ways for designers to put constraints on partitioning. The prior art method and structure allowed the designer to force specific flipflops to be part of the same logic block by giving the same block name attribute or the same "location" parameter to the flipflops, or to force specific flipflops to be part of different logic blocks by giving different block name attributes to them. Also, the designer was able to enter placement constraints 423, FIG. 4, to automatic placement and routing (APR) program 424 to revise the arbitrary placement.

Prior Art Placement and Routing

APR program 424 then completed the placement and routing of all blocks not placed and routed by the designer. Several placement and routing algorithms are available Jiri Soukup, "Circuit Layout", IEEE, vol. 69, Oct. 1981, pp. 1281–1304 gives an overview of the placement and routing problem and discusses several algorithms for placement and routing. Kirkpatrick et al, "Optimization by Simulated Annealing", Science, vol. 220, May 13, 1983, pp. 671–680 discusses a particular algorithm for placement and routing based on the concept of randomly moving elements in a manner analogous to molecular motion in a molten metal, where the algorithm seeks minimum cost of a particular placement and routing as analogous to molecules seeking a position of minimum energy. As with a molten metal, high temperature causes molecules to move temporarily to high energy positions, so with a placement and routing problem, the algorithm causes logic to be moved to high cost locations. As a metal cools, molecules move only to lower energy positions, eventually crystallizing into their final positions, so with the placement and routing problem, the circuit elements move to low cost positions. The algorithm has been found to produce good placement and routing solutions. Such a placement and routing algorithm specifically intended for the logic array chips described above is available by ordering XC-DS23 Automated Design Implementation (A.D.I.) software for IBM PC from Xilinx, Inc., 2100 Logic Drive, San Jose, Calif. 95124. The Xilinx placement and routing software is described in Chapter 3 of a manual entitled XACT LCA Development System, Volume II, also available from Xilinx, Inc., which is incorporated herein by reference.

After placement and routing, as shown in FIG. 4, the designer could examine LCA file 426, notice problems, and at step 425, edit placement file 426 (discarding some automatically generated routing). This step could result in the designer replacing routing performed by the computer to meet some requirements not met by the original automatic placement and routing program.

Whatever algorithm is used, there will be applications of the particular program in which the algorithm gives poor results. For example, the prior art partitioning part of the program could sometimes place minimally-related logic together in one logic block that should have been separated so that future placement and routing could succeed. The prior art algorithm would determine the degree of signal sharing and affinity between flipflop and logic groups in the design so that it could assign groups and flipflops with the highest degree of signal sharing and affinity into one logic block. As it worked its way down to the lowest degree of signal sharing and affinity it would sometimes assign two flipflops into the same logic block based only on the fact that they had shared a clock signal. Since it is common to have a single clock signal source many flipflops in a design, this might or might not be an acceptable pairing. If the flipflops are grouped with very different parts of the design, future placement and routing becomes difficult or impossible.

Makebits. The information in LCA file 426 on the configuration of each logic block, its location, and the lines interconnecting it are converted by makebits subroutine 428 to a bit file 429 in which each bit represents the state of a transistor in the logic array, the transistors controlling the connection of interconnect lines between logic blocks in the array and the configuration of the logic blocks themselves.

Configuration. This bit stream from bit file 429 is entered into an array of memory cells in the logic array chip through some of the external pins on the chip. Each memory cell controls one of the transistors in the array of logic blocks. When the memory cells have been set to their proper state, some of the corresponding transistors cause the interconnect lines to be connected as the routing portion of the computer program has specified, and other transistors cause the logic blocks to perform logic functions so that the logic array chip performs the function indicated by the designer's original schematic diagram or other original information.

Unsolved Problems

Designers frequently design their complex logic functions interactively with the programming of the actual logic cell array chip, testing their designs by using and testing the chip. When errors are found or changes are needed, the designer may know what specific changes should be made to the partitioning, placement and routing steps which have been performed automatically. Yet with the prior art when changes to the schematic diagram or Boolean equations were made and the automatic programming was again performed from the beginning, the partitioning, placement and routing may have been different from what the designer expected, causing the logic device to exhibit different electrical characteristics such as signal delay, or even producing an indication from the automatic programming means that the new design would not fit within the array chip.

For the example where the automatic means indicated the design would not fit, the designer may have known the design should fit if partitioning were performed in a particular way. Or the designer may have known the design change should not increase response time if partitioning and routing were performed in a particular way.

The prior art program has allowed for manual revision after the partitioning, placement, and routing which the computer has just performed. This manual step interfaced with the designer by displaying the completed layout on a computer monitor and allowing the designer to connect and disconnect interconnect lines between logic blocks and to delete and add connections inside logic blocks. This step gave the designer complete control of the design layout but was extremely cumbersome for the designer. The designer had to have intimate knowledge of the logic array chip to perform this manual step successfully. Further, it was very difficult for the designer to document the editing he performed, and difficult to reproduce the editing when subsequent changes were made.

Another shortcoming of the above prior art method was that it did not allow the designer using schematic entry (Step 412) a way to assign combinatorial logic gates to the same logic block the way flipflops could be assigned to the same logic block. Few designers had the degree of familiarity with the logic array architecture and the format of the configuration information that would have to be typed into the schematic when using symbols from library 411 to directly specify the functionality of a logic block. Thus manual control of the way a schematic diagram would be mapped into a logic cell was not conveniently available.

Furthermore, suppose a designer wished to simulate the design on a logic simulator. While logic simulators recognize standard symbols such as AND, OR, FF, etc. they do not recognize logic block symbols from library 411. Since with the prior art method the computer had no schematic diagram of a logic block entered directly in LCA file format, it was not possible to simulate the logic array if a logic block symbol was used.

Further, the designer may have wished to retain partitioning, placement and routing for identical and tested portions of a design, modifying and testing only small portions of the previous design. With existing automatic methods there was no convenient way to allow for small revisions in the schematic without reimplementing the whole design.

SUMMARY OF THE INVENTION

The present invention allows the designer to have manual control of the results in more ways and more conveniently than the prior art allowed.

With the present invention, it is possible to design by parts and to merge portions of the design at multiple points in the partitioning, placing and routing process. In contrast to the prior art, it is possible to merge portions after each has been partitioned. The designer may design parts of a logic array separately, partition them separately and merge them before placing and routing. As a further option, the designer may completely partition, place, and route one portion of the design, then partition, place, and route a second portion of the design without disturbing the first portion. These improvements are provided without loss of options in the prior art program described above. Thus the designer retains the option of entering schematic information manually and of editing the design manually.

It is further possible, once a design has been partitioned, placed, and routed, to change parts of the design, and to partition, place and route only the changed parts without changing the partitioning, placement and routing of the remainder of the design.

Also, the designer may provide partitioning specifications as input to the computer program, thereby exerting control over which of the designer's logic gates are grouped together into a single logic block of the array. With the present invention manual control of partitioning is convenient.

Additionally, the designer may use a computer program to generate partitioning information and may use the computer generated partitioning information when implementing the design. As in the prior art, the designer can use a logic block symbol to specify a part of the design to be partitioned into one logic block. However, with the present invention, in contrast to the prior art, the designer (or a computer program used by the designer for generating partitioning information) does not have to define the internal configuration of the logic block; the designer merely has to specify which signals of the design should appear on the input and output leads of the block. As a result, documentation of revisions is easy for the designer. In contrast to the prior art, the present invention allows the designer to specify the contents of a logic block while retaining the ability to simulate the logic in a logic simulator.

With the options of designing and partitioning by parts, specifying at least some of the contents of a logic block before beginning the program, and adding changes to a completed design the designer is likely to need the more cumbersome manual methods less often.

To allow for manual control of partitioning, a library of symbols includes a partitioning symbol which can be effectively placed on top of a portion of a user's logic design. This partitioning symbol is in addition to primitive symbols such as AND, XOR, flip flop, etc., which are also in the library. The user attaches the same signal names to ports on the partitioning symbol as are attached to signal lines connected to selected primitive symbols in the circuit design. This specifies that the primitive symbols included in a region connected to signal lines whose names are attached to ports of the partitioning symbol are to be grouped into a logic block.

When the computer program partitions the schematic into logic blocks, it will first locate the logic specified by any partitioning symbols within a logic block, if possible. The portions of logic for which a partitioning symbol is not specified are partitioned by an automatic partitioning algorithm.

To allow for partitioning by parts, the method merges one or several unpartitioned files with one or several partitioned files. Partitioned and unpartitioned files are in different formats. However, this is the same situation as when the program has partly completed its allocation to groups of the gates in an unpartitioned file.

To allow for making changes to a completed design, the method allows the designer to prepare a new design by editing a copy of the original design to remove portions not to be used and to add new portions. Names of the signal lines remain the same except where the designer has modified the design. When the partitioning program is run with the edited design, all blocks for which content is the same are again given the same names.

The partitioned blocks of the new design are compared to blocks of the old design. When there is a match, the computer program places the blocks in the same location as were occupied by the old blocks.

Only new blocks need be placed and routed. Circuit characteristics associated with parts of the design not changed will remain the same. The designer is relieved from having to repeat earlier manual work.

BRIEF DESCRIPTION OF THE DRAWINGS

FIG. 2b provides a legend of symbols used in FIG. 2a.

FIG. 7b shows as an example a portion of a schematic diagram to be grouped into a logic block symbolized by the CLBMAP symbol of FIG. 7a.

FIGS. 8a-8c show block representations, block placement, and routing of a logic design.

FIGS. 8d-8f show block representations of a revised design, block placement according to the present invention which uses earlier block placement as a guide, and routing of a revised design using earlier routing as a guide.

DETAILED DESCRIPTION OF SOME EMBODIMENTS OF THE INVENTION

Attached as part of microfiche Appendix 1 to the application are C programming language source code subroutines for carrying out specific portions of one embodiment of the present invention. These source code sections recite a set of steps for allowing a designer to specify portions of a schematic to be implemented by a logic block. The main C-program for controlling the logic flow uses subroutines listed under the heading XNFMAP.C starting at frame 375 near the end of Appendix 1. Attached as microfiche Appendix 3 are C programming language subroutines which merge portions of a design after partitioning.

Figure 6:
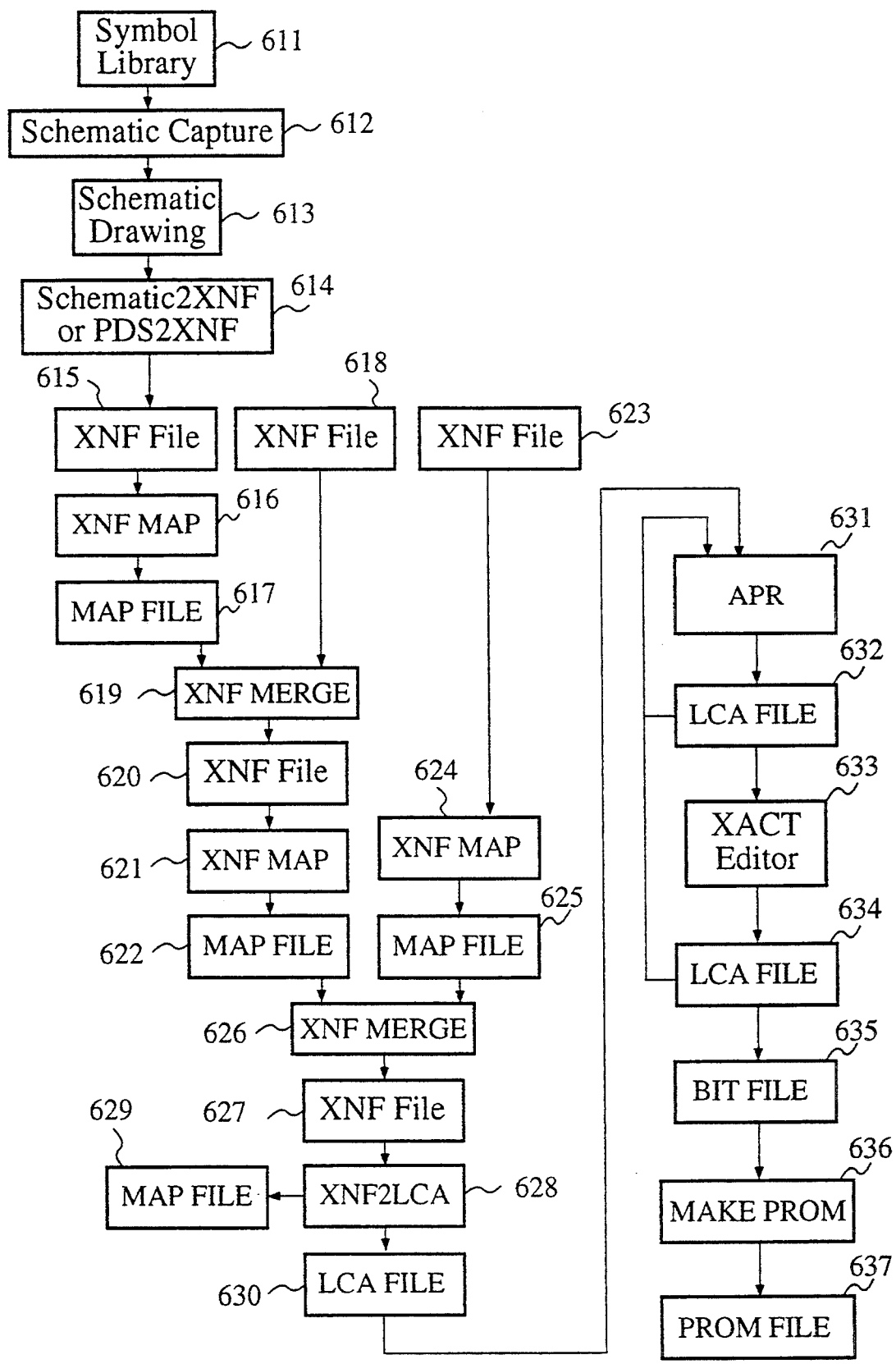
FIG. 6 shows an overview of the steps in configuring a logic array as provided by the present invention.
Figure 7A:
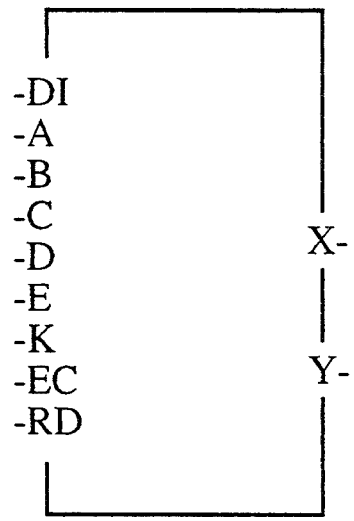
FIG. 7a shows a CLBMAP symbol stored in a symbol library, according to the present invention.
Figure 7B:
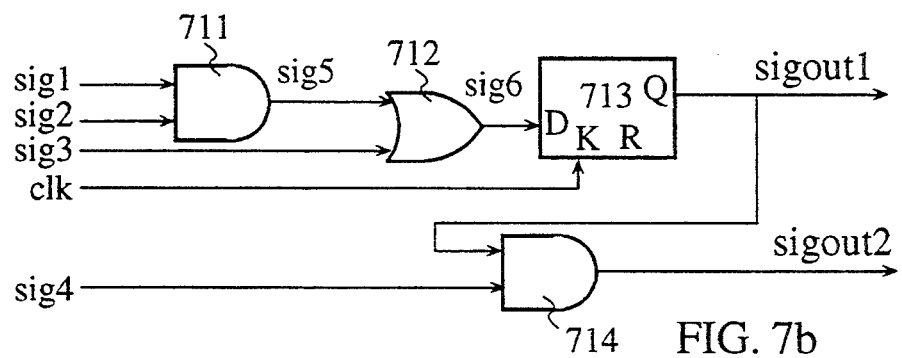
Figure 7C:
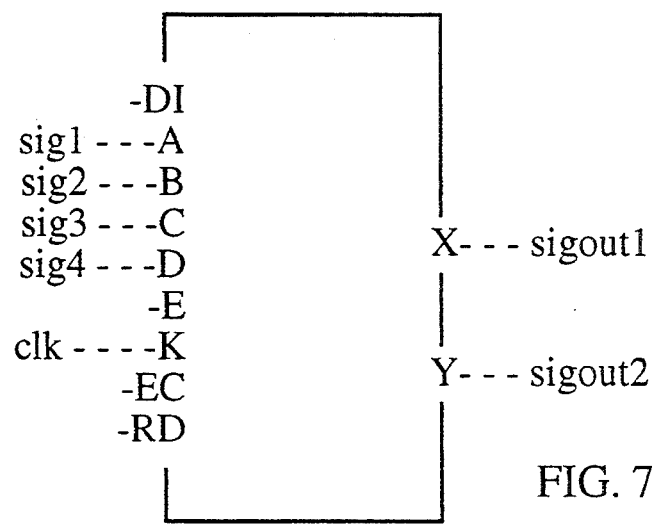
FIG. 7c shows the CLBMAP symbol of FIG. 7a with designations to indicate that the logic of FIG. 7b is to be included in one CLB.

FIG. 6 shows the steps which can be performed according to the present invention to allow manual control of the process for configuring a logic cell array. As with the prior art method, a designer may enter a logic design into the computer program by using schematic capture package 612 which uses symbols from library 611 to generate a schematic drawing. In addition to the prior art symbols included in library 411 of FIG. 4, symbol library 611 includes a set of CLBMAP symbols to represent logic blocks. FIG. 7a shows a CLBMAP symbol for the configurable logic block of FIG. 3b. Other CLBMAP symbols are provided for other kinds of configurable logic blocks. In addition to entering the schematic information such as shown in FIG. 7b using standard logic symbols (AND, OR, etc.), a designer may call a CLBMAP symbol such as that of FIG. 7a from symbol library 611, and attach names of signal lines to the input and output ports of the CLBMAP symbol. The CLBMAP symbol does not replace symbols for the combinatorial logic gates included in the logic block but effectively "sits on top" of the logic in the schematic. Thus the designer must still specify the AND, OR, and other symbols and their interconnections to be provided in the CLB represented by the CLBMAP symbol. As shown in FIG. 7c, by attaching names of signal lines in the schematic of FIG. 7b to the ports of the CLBMAP symbol of FIG. 7a, the designer can conveniently specify the partitioning of the logic shown in FIG. 7b into a logic block.

Figure 1:
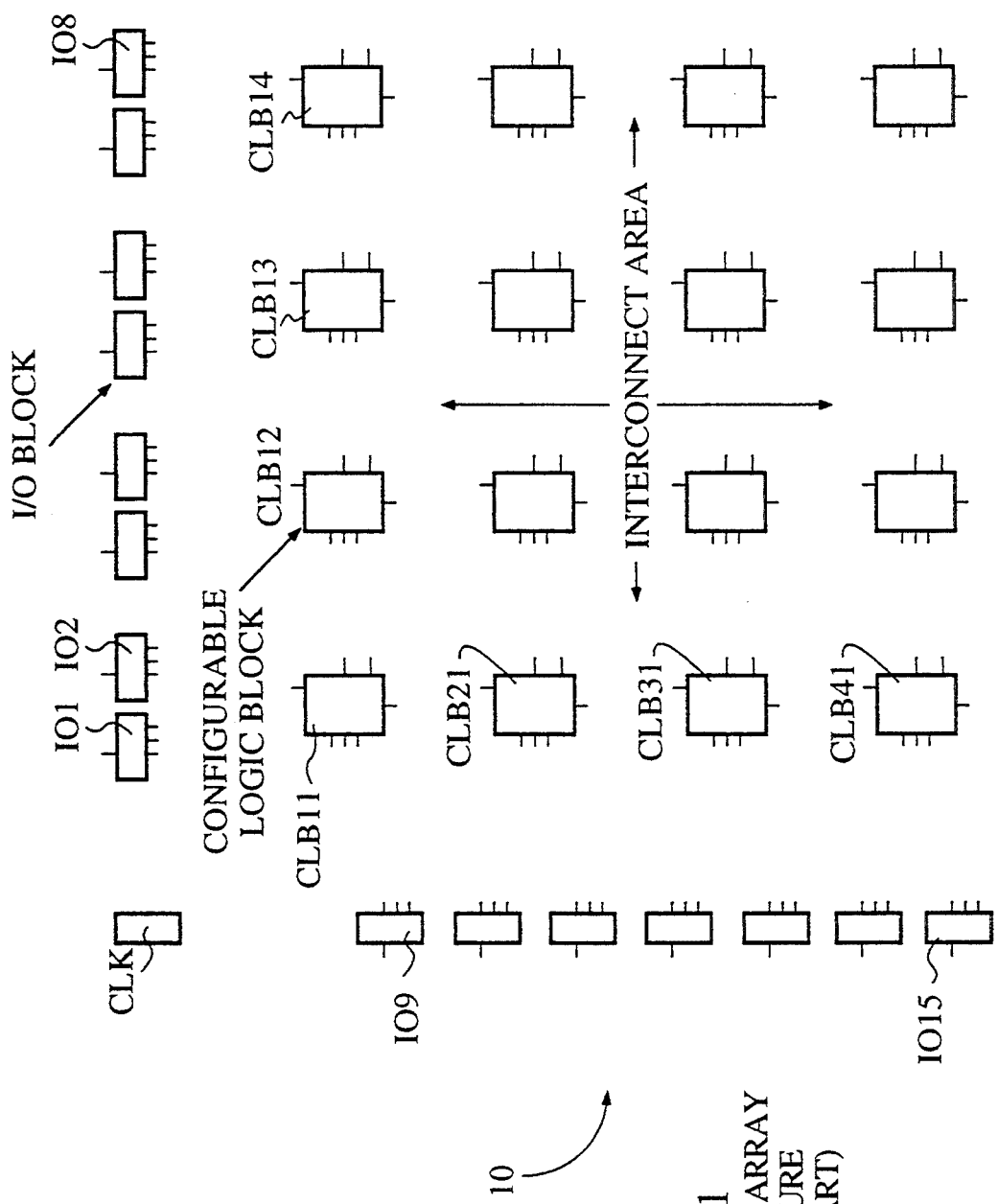
FIG. 1 shows part of one of the logic cell array chips for which automatic programming is available.
Figure 2A:
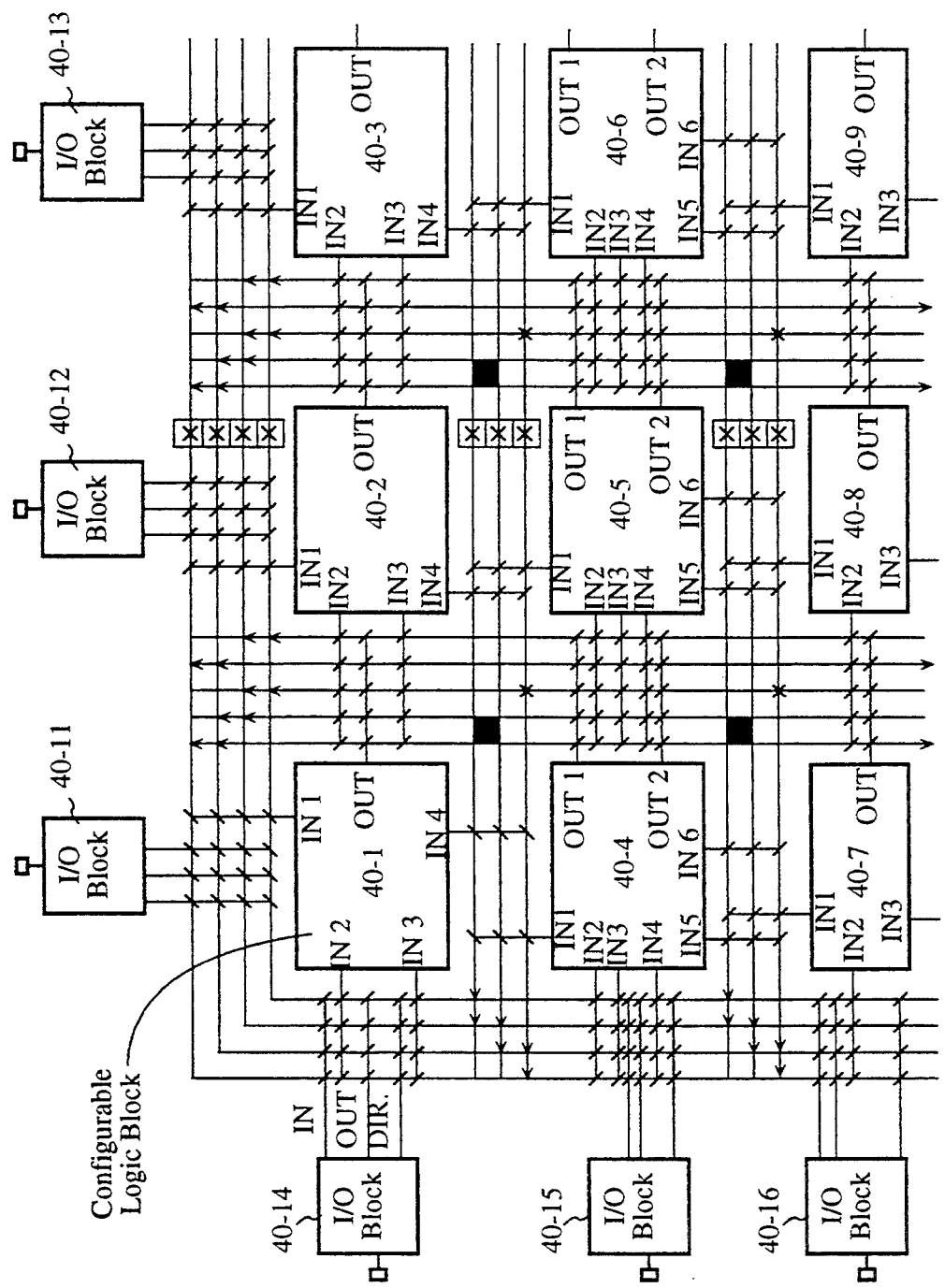
FIG. 2a shows a small portion of a logic cell array chip with interconnects for connecting leads of one CLB or IOB to another CLB or IOB.
Figure 2B:
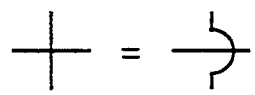
Figure 2B:
Figure 2B:
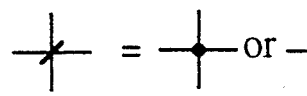
Figure 2B:
Figure 2B:
Figure 2B:
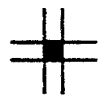
Figure 2B:
Figure 2B:
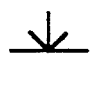
Figure 2B:
Figure 2B:
Figure 2B:
Figure 2B:
Figure 2B:
Figure 2B:
Figure 2B:
Figure 2B:
Figure 2C:
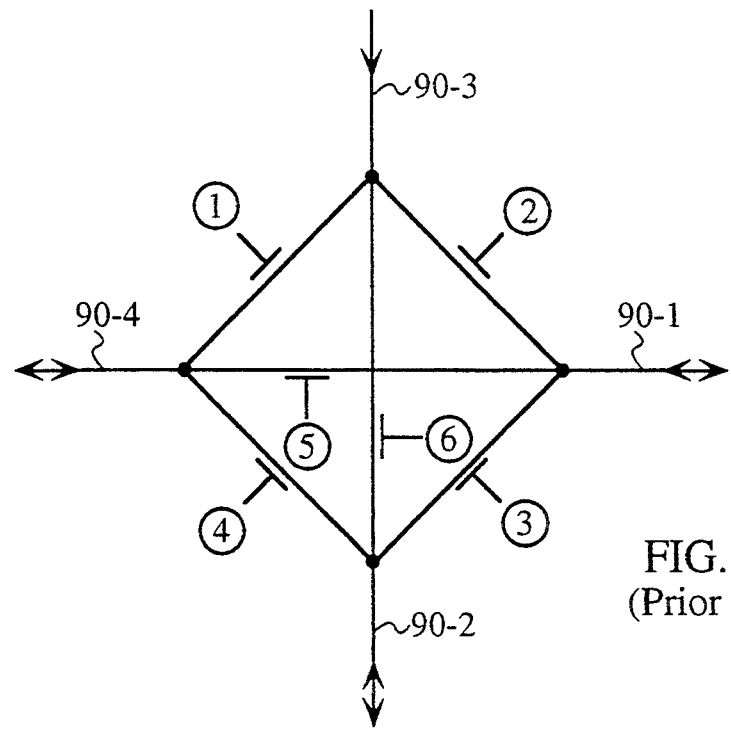
FIGS. 2c and 2d show in detail circuits which implement two of the symbols shown in FIGS. 2a and 2b.
Figure 2D:
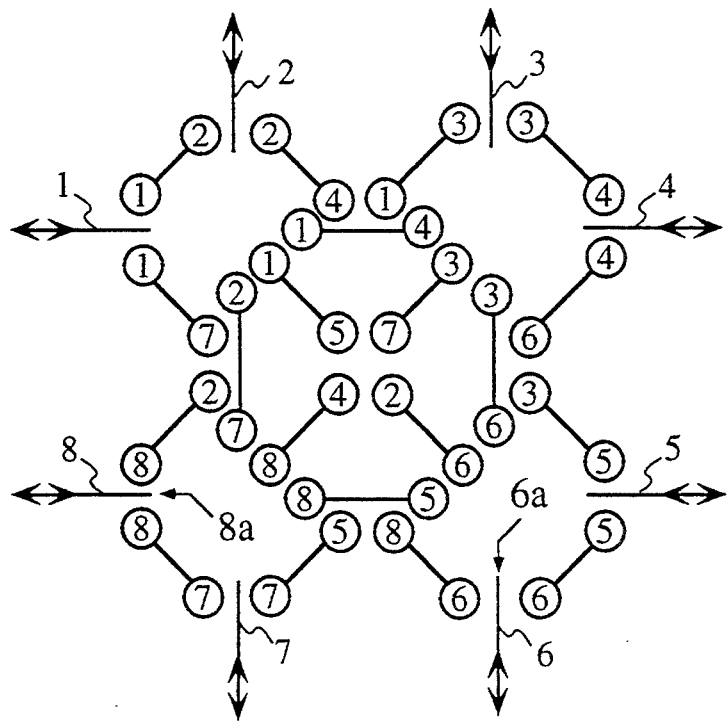
Figure 3A:
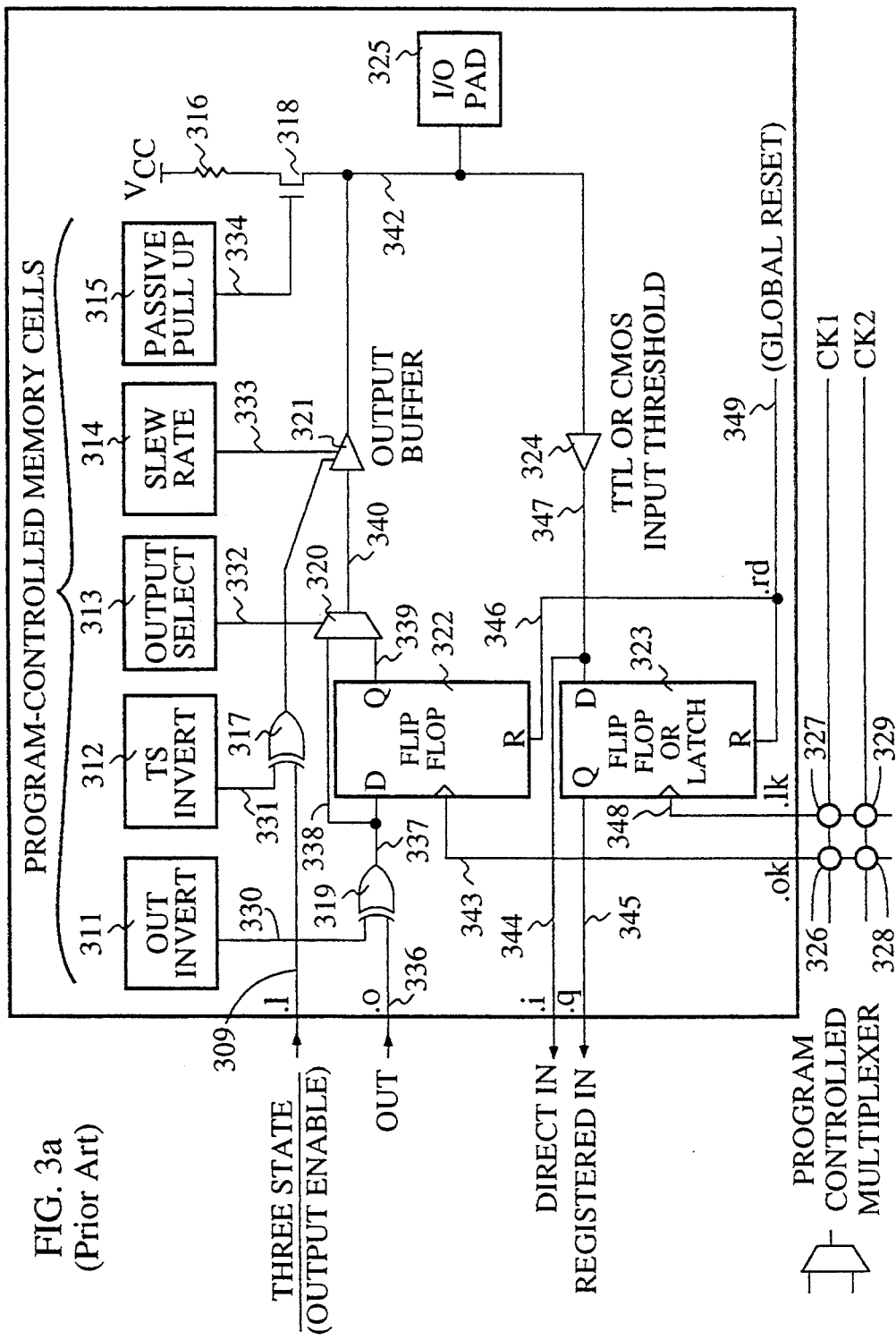
FIG. 3a shows one input/output block which can be configured using the present invention and FIG. 3b shows one configurable logic block which can be configured using the present invention.
Figure 3B:
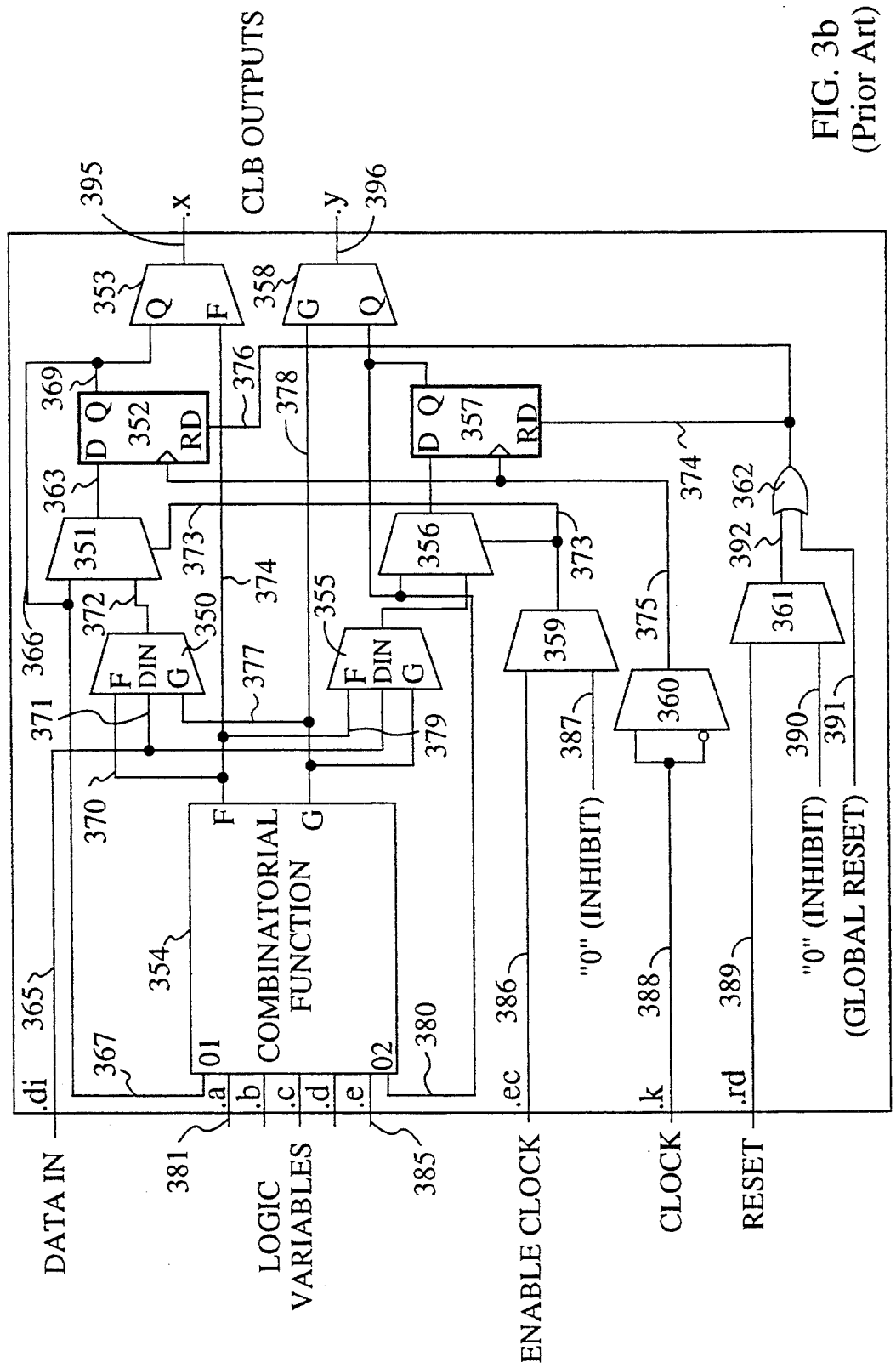

In FIG. 7a, DI indicates a direct input to the data input of a D-flipflop in the logic block (equivalent to line 365 of FIG. 3b), A through E indicate input lines leading to one of the combinatorial logic function input leads (equivalent to lines 381 through 385 of FIG. 3b), K indicates a direct input to the clock line of the D-flip- flop in the logic block (equivalent to line 388 of FIG. 3b), EC indicates the enable-clock line (equivalent to line 386 of FIG. 3b), RD indicates the reset line (equivalent to line 389 of FIG. 3b) and X and Y indicate output lines (equivalent to output lines 395 and 396 of FIG. 3b).

Figure 4:
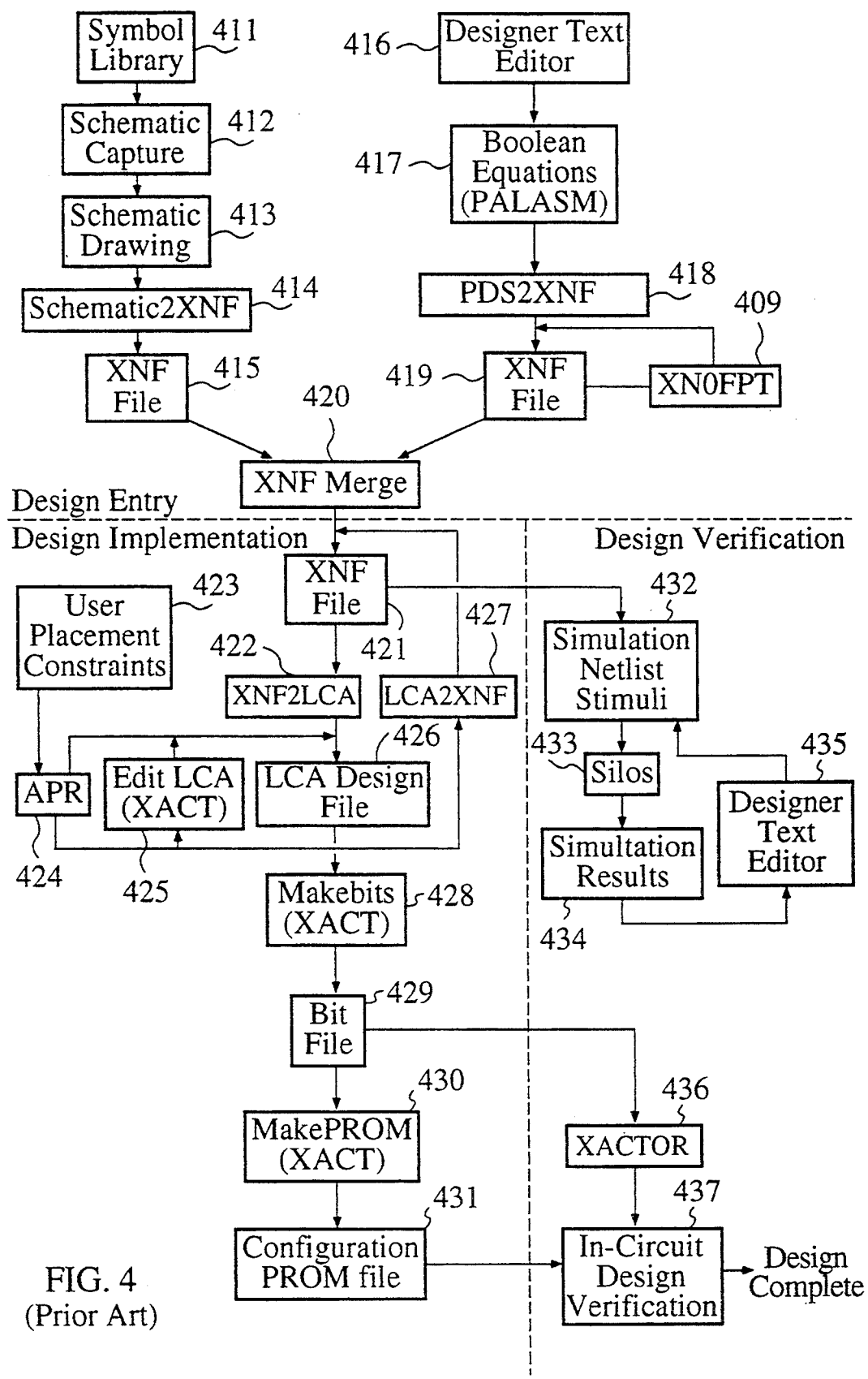
FIG. 4 shows an overview of the prior art steps in configuring a logic array.

Alternatively, though not shown in FIG. 6, the designer may enter Boolean equations just as was done with the prior art system shown in FIG. 4.

Next, a computer program at step 614 converts the designer's initial information to XNF file 615. The XNF file has a format similar to that of prior art Table 1 except that it may include CLBMAP symbols.

Next, the program XNFMAP (616 in FIG. 6) forms MAP FILE 617 of partitioned blocks. When the computer program partitions the schematic into logic blocks it will first locate the logic specified by any CLBMAP symbols within a block, if possible. The portions of logic for which a CLBMAP symbol is not provided are partitioned by an automatic partitioning algorithm. Table 5 shows a flow diagram of steps used in one embodiment of the invention which performs XNFMAP step 616 (also 621 and 624), first responding to CLBMAP symbols in which the designer specifies partitioning and next performing the automatic steps to partition the remainder of the design.

TABLE 5

Logic used in XNFMAP to
Partition a User's Logic Gates into Groups,
Each Group to be implemented by a Logic Block
(FIG. 6, XNFMAP step 616)

Read all symbols in XNF file (includes standard logic gate symbols plus
logic block (CLBMAP) symbols (READNET())
Check network for errors (NETCHECK())
Process CLBMAP symbols and assign to CLBs (MAPCLBS())
Simplify unpartitioned logic (RMLOGIC())
Partition logic and assign LCA resources (MAKELCA())
    Make combinatorial logic groups (MAKEGROUPS())
        For every signal line on a non-combinational logic symbol that is
        not already in a group, make a group (MKGROUP())
            Working backward through the network from the given signal,
            add to the group all the gates whose output signals
            exclusively source only other gates in the group. Stop
            searching a signal path when a stop condition is met - a non-
            combinatorial gate, a gate whose output signal sources a gate
            not in the group, or a signal marked with the user-explicit
            flag which indicates the signal needs to be kept outside any
            logic block.
        For every input signal to a macro (a symbol not of a known type,
        treated as a 'hole' in the design) that is not already in a
        group, make a group (MKGROUP())
        For every input signal to a CLBMAP that is not already in a
        group, make a group (MKGROUP())
    Assign clock buffers (CLKASSIGN())
    Assign IO blocks (IOASSIGN())
    Assign 3-state buffers (TBUFASSIGN())
    Assign CLB blocks (CLBASSIGN())
        Assign FF D pin signal groups (ASSIGNDGRPSo), reducing the size
        of the D pin group if necessary (BRKGROUP())
            Initialize symbol TABLE and signal TABLE for the group,
            assigning all symbols and signals to a remainder group
            (INITSYMBLO, INITSIGTBL())
                Move target signal symbol into target group, lock, and
                initialize best group (MOVESYM())
                    For all symbols in the remainder group, move the symbol
                    to the target group.
                    If new target group is better, set the group to be the
                    best found so far. (BETTER())
                        Compare best-so-far and current target group tables
                        to determine which group is better. Check the
                        following conditions and exit once a single
                        condition is met:
                        1. If current "target" group has too many input
                        signals for a function, keep the "best" group.
                        2. Keep group with more internal critical
                        signals.
                        3. Keep group with more critical input signals.
                        4. If both groups have known CLB-usage counts,

TABLE 5-continued

Logic used in XNFMAP to
Partition a User's Logic Gates into Groups,
Each Group to be implemented by a Logic Block
(FIG. 6, XNFMAP step 616)

keep group that uses fewest CLBS.
        5. If "best" has a known CLB-usage count and
        "target" has only an estimate, keep "best" if its
        count is < = estimate of "target" , else keep
        "target".
        6. If "target" has a known CLB-usage count and
        "best" has only an estimate, keep "target" if its
        count is < = estimate of "best" , else keep "best".
        7. Keep group with more Q feedback inputs
        8. Keep group with more symbols in it.
        9. Keep group with fewer input signals.
        10. Keep group with fewer signals interior to the
        original group (reduces fragmentation of
        remainder)
        11. Keep group with fewer non-critical interior
        signals.
        12. Keep group with fewer non-critical input
        signals.
        13. If no difference, keep "best".
    If new target group is better, set target group to
    be the best so far.
  Build new groups from the input signals to the target
  group (BUILDGRPS())
For all groups that are not assigned and whose number of
primary inputs is greater than the maximum, break up the
group (BRKGROUP())
Assign FFs together that should be paired in a single CLB
according the number of pins they can share (ASSIGNFFS())
Read all CLBMAP symbols. Location specified by user?
  Yes: Replace the CLB having that location in the final list
  of CLBs with the free-floating CLB symbol which was
  partitioned according to the CLBMAP information
  (SUBMAPCLB())
Read all FFs and prepartitioned CLB symbols. Location specified
by user?
  Yes: Is symbol a FF?
    Yes: Add the FF and any associated elements such as its
    paired FF and assigned D-pin groups to the CLB having the
    specific location in the list of final CLBs (ADDLATCH())
    No: Replace CLB having the same location in the final list.
Read all CLBMAP symbols. Already assigned to CLB?
  No: Replace its associated free-floating CLB in the list of
  final CLBs at any unused location.
Read all FF and prepartitioned CLB symbols. Not yet assigned to
CLB?
  Yes: Is symbol a FF?
    Yes: Add the FF and any associated elements such as its
    paired FF and assigned D-pin groups to any unused CLB in
    the list of final CLBs (ADDLATCH())
    No: Replace CLB in the final list at any unassigned
    location.
Read all combinatorial logic groups. Does group need maximum
number of inputs, and is group not assigned to a CLB already?
      Yes: Assign the group to an unused CLB (ADDLOGIC())
Read all combinatorial logic groups. Still not assigned to CLB?
  Yes: Find optimal placement for the group, either in a
  partially filled CLB, in a CLB by itself, or in a CLB with
  another group (ASSIGN())
Assign logic group and FF input signals to best CLB pins
(CLBINASSIGN())
Name the CLBs and IOBs (NAMEBLKS())
Trim unused logic from CLBs and IOBs (TRIM_ALL_BLKS())

MAP FILE 617 indicates which nodes on the original schematic are now associated with each input and output lead to each block. Table 4, below shows an example MAP FILE 617 for part of the example shown in FIG. 5a, discussed earlier. The entries shown in Table 4 refer to logic block AB of FIG. 5b.

TABLE 4

| MAP FILE entries |
| --- |
| 1 SYM, q2out, CLB |
| 2 CFG, Base FG |
| 3 CFG, Config X:QX Y:QY RSTDIR: ENCLK: DX:F DY:G |

TABLE 4-continued

| MAP FILE entries |
| --- |
| CLK:K F:A:D G:B:C:E |
| 4 CFG, Equate F=(A@D) |
| 5 CPG, Equate G=(B+(C*E)) |
| 6 PIN, A, I, xor1_2, |
| 7 PIN, B, I, or1_2, |
| 8 PIN, C, I, and1_2, |
| 9 PIN, D, I, xor1_1, |
| 10 PIN, E, I, and1_1, |
| 11 PIN, K, I, clkout, |
| 12 PIN, X, O, q2out, |

TABLE 4-continued
MAP FILE entries

```
13 PIN, Y, O, q1out,
14 MODEL
15 SYM, and1_out, AND
16 PIN, O, O, and1_out,
17 PIN, 2, I, and1_2,
18 PIN, 1, I, and1_1,
19 END
20 SYM, or1_out, OR
21 PIN, O, 6, or1_out,
22 PIN, 2, I, or1_2,
23 PIN, 1, I, and1_out,
24 END
25 SYM, xor1_out, XOR
26 PIN, O, O, xor1_out,
27 PIN, 2, I, xor1_2,
28 PIN, 1, I, xor1_1,
29 END
30 SYM, q1out, DFF
31 PIN, Q, O, q1out,
32 PIN, D, I, or1_out,
33 PIN, C, I, clkout,
34 END
35 SYM, q2out, DFF
36 PIN, Q, O, q2out,
37 PIN, D, I, xor1_out,
38 PIN, C, I, clkout,
39 END
40 ENDMOD
41 END
```

Note that the MAP FILE format of Table 4 is similar to parts of Table 1 and Table 2. As in Table 1, the first line begins with "SYM" indicating a symbol is to be described The symbol is named "q2out". Unlike the XNF file described in Table 1, this MAP FILE includes symbols identified by lines SYM which are not part of the conventional logic vocabulary (AND, OR, etc). The symbol on line 1 is "CLB", which stands for configurable logic block. The next four lines (2-5) recite the interior configuration of the configurable logic block. Lines 3, 4, and 5 of Table 4 are similar to lines 20, 21, and 22 of Table 2. Since the entries included in lines 3, 4, and 5 of Table 4 were discussed in detail in connection with Table 2, the meanings of the entries will not again be described here. The next eight lines (6-13) describe the exterior connections A, B, C, D, E, K, X and Y to the configurable logic block (FIG. 7a). Line 6, for example, indicates port (pin) A of this CLB will be an input port and will receive the "xor1_2" signal. Thus the first 13 lines of Table 4 specify the configuration and connection of CLB AB shown in FIG. 5b. The next lines (14-40) in Table 4 between the word "MODEL" and the word "ENDMOD" represent the interior configuration of the CLB in a format using standard logic symbols which can be recognized by a logic simulator.

Figure 5A:
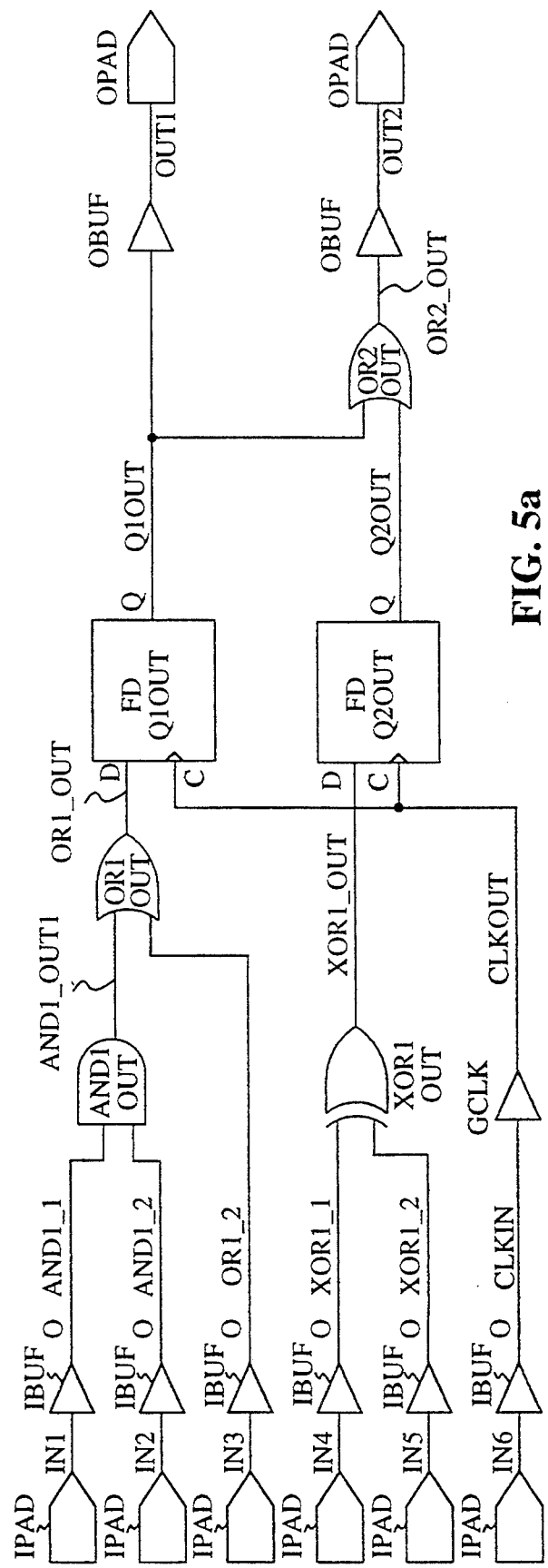
FIG. 5a shows an example schematic diagram and FIG. 5b shows blocks into which the schematic of FIG. 5a is partitioned using a prior art method.
Figure 5B:
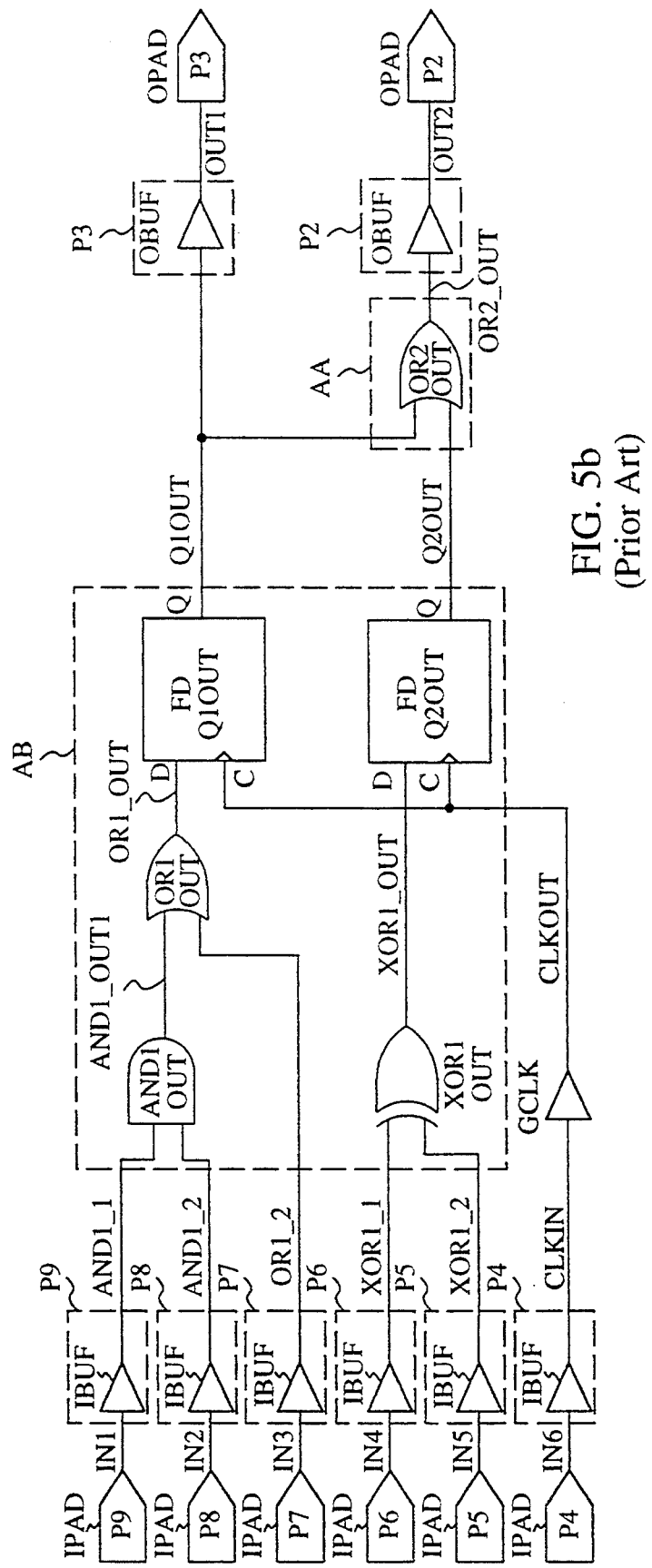

Using the prior art method of FIG. 4 and a prior art algorithm, the example of FIG. 5a would have been partitioned into the blocks shown in FIG. 5b. However, the example of FIG. 7b would have been partitioned differently by the prior art method than by the partitioning specified by the CLBMAP symbol of FIG. 7c. The group of combinatorial logic gates 711, and 712, shown in FIG. 7b would not have been placed into the same logic block of FIG. 3b with gate 714 by the algorithm that moves backward through the logic flow and stops grouping gates when another flipflop is reached because the algorithm in moving backward from gate 714 would refuse to add flipflop 713. AND-gate 714 would have been placed into a different block from flipflop 713, even though the logic block (FIG. 3b) can accommodate the gates of FIG. 7b.

In a schematic including the combinatorial logic gates of FIG. 7b, according to the present invention, during the schematic capture step 612 (FIG. 6), a designer may call the CLBMAP of FIG. 7a and specify the input and output signals as shown in FIG. 7c.

The designer may perform this step of attaching names of signal lines either by typing the names on a keyboard while the computer is displaying a CLBMAP symbol on a monitor and highlighting the ports to which the names will be attached, the typed names being entered as shown in FIG. 7c in response to keyboard input by the designer, or the designer may enter a CLBMAP symbol into the schematic drawing connected in parallel with selected logic gates to show that these logic gates are to be included in the partitioned group. Alternatively, the designer may use a separate computer program which uses CLBMAP symbol present in library 611 to generate a file of partitioning specifications which is then used by the present invention as a file generated manually would be used. CLBMAP symbols may also be generated by logic design programs in conjunction with generating the original design.

According to the present method, input leads "sig1" and "sig2" of gate 711 (see FIG. 7b) are specified by the designer to be placed on leads A and B respectively of the CLBMAP of FIG. 7a. The "sig3" input lead, which provides one input to OR gate 712, is placed on lead C of the CLBMAP of FIG. 7a. Clock signal clk which is connected to the D-flipflop clock pin K of FIG. 7b is placed on lead K of the CLBMAP of FIG. 7a. Output signal "sigout1" and input lead "sig4" provide input to AND gate 714. The output signals "sigout1" and "sigout2" from D-flipflop 713 and AND-gate 714 respectively are placed on leads X and Y respectively of the CLBMAP of FIG. 7a. Thus the CLBMAP of FIG. 7a is configured by the designer (or by a computer program used by the designer) to the CLBMAP of FIG. 7c, which specifies that the portion of the schematic in FIG. 7b will be partitioned into a single CLB. Two related logic equations will be generated for each CLB to specify how the two combinatorial functions of the logic block are to be programmed. For the logic block of FIG. 7c which implements the combinatorial logic gates of FIG. 7b, the two equations are $$sig6 = (sig1 \text{ AND } sig2) \text{ OR } sig3$$

$$sigout2 = sig4 \text{ AND } Q$$

Then when the partitioning program 616 is forming MAP FILE 617, the schematic portion shown in FIG. 7b will be placed into a logic block before using the usual algorithm for partitioning blocks, and the designer's objective is achieved.

The automatic partitioning program partitions the remaining part of the schematic automatically, as was done with the prior art method.

Returning to FIG. 6, a second XNF file 618 (or several XNF files) can be merged with MAP FILE 617 and the mapping function repeated at step 621 to allocate combinatorial logic gates in XNF file 618 to groups of logic to be implemented in logic blocks of the array not yet used by XNF file 615. It should be noted that at this stage of the program, the two files are in different formats, the information from XNF file 615 having been partitioned into logic blocks, and the information from XNF file 618 not yet having been partitioned. This mismatch, however, is no different from that which exists when the program has partly completed its allocation to logic groups of the gates in XNF file 615. Since a MAP FILE is simply an arbitrarily placed and unrouted set of logic groups, each to be implemented in a logic block with corresponding logic equations for combinatorial functions within the block, it is logical to simply add combinatorial logic gates to the entries in MAP FILE 617, partitioning the new combinatorial logic gates into new logic blocks having corresponding new MAP FILE entries as the new portions of logic are added. Of course, the program must check to see if the number of available blocks in the logic array has been exceeded and for other unacceptable conditions, for example a mismatch between types of integrated circuits specified by the logic symbols and the designer.

The program takes the new XNF file 618 and at step 619 merges it with MAP FILE 617 to form a single XNF file 620, and in XNF MAP step 621 partitions the new logic to form a single MAP FILE 622. At this point it is again possible to merge another MAP FILE 625 which has been partitioned in XNF MAP step 624 from XNF file 623.

In the case where separate MAP FILEs 622 and 625 have been partitioned separately and then merged at step 626, the XNF file 627 is really a MAP FILE since all portions of the logic have already been partitioned.

Such late merging comes from designing a logic array by parts. If merging occurs after partitioning, the partitioning will likely be different from the partitioning which would occur if all portions of the logic were merged before partitioning. Generally, if the partitioning algorithm loads logic blocks to their maximum density, merging all files before partitioning results in using fewer logic blocks, but may result in grouping unrelated logic functions into the same block, making the blocks more difficult to place and route. If logic functions in a single block must be connected to logic functions in two other blocks physically far from each other, considerable interconnect length may have to be allocated to very few logic functions. Partitioning parts of a design before merging may require more logic blocks, but the blocks are likely to be placed and routed more efficiently.

In XNF2LCA step 628 the program uses two subprograms, first the XNF MAP subprogram used in steps 616, 621, and 624 and then a subprogram called MAP2-LCA to generate LCA file 630. XNF MAP subprogram will produce MAP FILE 629 from XNF FILE 627.

Before the XNF MAP subprogram writes the MAP FILE, it will trim unused logic from the partitioned blocks. Trimming unused logic consists of eliminating logic which provides an output signal not used by another part of the array or not leading to a chip pin. When this trimming step is performed, the program works backward from each unused output line to input lines which feed the unused line and nothing else, and may eliminate entire blocks of logic if they are not used. This step is particularly useful when a designer is redesigning and eliminates a previously used output. With automatic logic trimming the designer does not need to concern himself with manually trimming logic which became unused as a result of redesigning.

At this point the automatic placement and routing program (APR) 631 places and routes the logic blocks. As mentioned in the discussion of prior art above, there are several placement and routing algorithms available. Xilinx, Inc. provides an automatic placement and routing program available as XC-DS23, mentioned earlier, which can be used to generate placed and routed LCA file 632.

Because of certain features of the above described logic array chip, for example certain interconnect lines extending the length or width of the chip and others extending only a short distance across the chip, and certain interconnect lines including buffers, routing will work better and the resulting characteristics will be desirable to the designer if blocks are placed and routed in a certain way. For example, in an embodiment in which lines run the full length of the array vertically between columns of logic blocks and these long lines are provided to the clock input of each logic block, registers and counters are best placed in the same column. For another example, output signals which fan out may best be routed through a buffered interconnect line. Such characteristics of the particular logic array are preferably accounted for by the particular placement and routing algorithm.

An automatic placement and routing program may work fine for updating an existing schematic design when the designer has not done any manual placement and routing of the first schematic design. But when the designer programmed a logic cell array and implemented his first schematic design using at least some manual placement and routing, found mistakes in the first schematic design, and changed the original schematic to correct the mistakes, the considerable work to manually partition, place, and route the original schematic design would have to be repeated by the designer for the new design. Even for placing and routing in which no work was done manually, the designer who makes minor modifications to an existing design may wish to keep certain earlier placement and routing identical so as not to change circuit timing or other subtle features of the earlier placement and routing. The present invention allows for this option.

Modification Method Using Guide

The present invention provides another feature whereby a designer may make minor modifications to an existing design very easily, even if manual work were used in generating the original design. In accordance with this feature, the original design is used as a guide in subsequent placing and routing of a similar design and may also be used for subsequent partitioning.

FIGS. 8a-8f show how the guide feature of the invention is used. As shown in FIG. 8a, the original design is partitioned into 11 of the 16 blocks of the array. FIG. 8a represents the LCA file entries (such as shown in Table 4) after partitioning with the XNF2LCA program 628. As discussed in conjunction with Table 4, associated with each block name is a description of block contents and signal lines to be connected to that block. The partitioned blocks are shown in arbitrary order in FIG. 8a. The designer may have placed constraints on the partitioning of some logic blocks by forming CLBMAPs for those blocks. Such CLBMAPs will have influenced the formation of the blocks shown in FIG. 8a, as discussed earlier. As shown in FIG. 8b, this original design is then placed, the blocks being moved from their arbitrary locations in FIG. 8a to locations which will be easy to route. As shown in FIG. 8c, the original design is now routed.

The designer may prepare a new design by editing a copy of the original design to remove portions not to be used and add new portions. Names of signal lines remain the same except where the designer has modified the design. When the partitioning program XNFMAP (see step 616 of FIG. 6) is run with the edited design, all blocks for which content is the same are again given the same names. FIG. 8d shows a revised MAP file partitioned but not yet placed. The only manual work required of the designer to reach this point was to revise portions of the schematic. No modification of the original placement constraints has been necessary.

Appendix 2 provides C programming language source code for using the original placement and routing as a guide to the revised placement and routing steps illustrated in FIGS. 8e and 8f. The partitioned blocks of the new design are compared to blocks of the old design. Where there is a match, the computer program APR 631, places the new blocks in the same locations as were occupied by the old blocks. In the example of FIGS. 8a–8f, there is an OLDBLK2 in the original design of FIG. 8a but no OLDBLK2 in the new design of FIG. 8d. Likewise there are two new blocks, NEWBLK1 and NEWBLK2 in FIG. 8d which were not present in FIG. 8a. FIGS. 8e and 8f show that placement and routing of the new design is repeated except for the blocks which do not repeat.

At the point shown in FIG. 8f the computer program APR 631 (FIG. 6) needs only place and route NEWBLK1 and NEWBLK2 to complete the placement and routing of the new design. Circuit characteristics associated with parts of the design not changed will remain the same. The designer is relieved of having to repeat earlier manual work. Also, this feature saves work for the APR program 631 and consequently the APR program will execute faster. This feature of the invention can incorporate large as well as small additions to an existing design as long as the new blocks generated by partitioning the new schematic do not exceed the capacity of the logic cell array.

These are the rules for matching blocks between the original design and the revised design.

For CLBs and IOBs: Only the names of the blocks must match. In the presently described embodiment, CLBs and IOBs have names associated with them. (Names may be provided by the designer, otherwise they are automatically generated by the program and preferably match names of one of the output signals they provide).

For all other blocks (3-state buffers, pullup resistor blocks, clock buffers): These blocks do not have names. The names of the signals attached to the blocks must match.

In an embodiment in which all blocks always having names associated with them, regardless of block type, then the 'names of the blocks must match' rule may be used for all blocks.

Note that using this modification method, identifying a block as identical to a previous block for the purpose of placing and routing does not require that the content of the block remain the same. Thus a designer may use this modification guide feature very advantageously to maintain identical placing and routing when all modifications are interior to blocks.

Manual Editing

Returning to FIG. 6, as with the prior art method described above, LCA file 632 can also be edited manually using XACT editor 633 to make specific changes at particular points in the interconnect routing or in the interior of the logic blocks.

Once the LCA file 634 contains the placement and routing of the designer's final design, the MAKEBITS program converts the information contained in the LCA file 634 into the BIT file 635. This file contains the sequence of bits, known as the configuration bit stream, which when loaded into the logic cell (block) array (LCA), will cause the LCA to perform the function specified by the designer's design. To accomplish this conversion, the MAKEBITS program first examines both the internal configuration of each logic block and the interconnect path of each signal. It then sets the appropriate bit values within the bit file. The program also sets bits as necessary so as to ensure that all interconnects within the LCA are either used by a signal or are tied to either the positive or negative voltage supply. This is done to prevent floating inputs which can cause unnecessary power dissipation during operation of the LCA.

This bit file 635 is then loaded into a means for storing the data. This may be in PROM FILE 637, on a magnetic disk, a RAM, or various other means for storing. From this means for storing, the data are passed into the array of memory cells for controlling each of the transistors in the logic array chip. Once the memory cells of the logic array chip have been loaded, the logic array chip performs as specified by the designer's original schematic diagram (or other original information) as modified by any intervening changes the designer has entered using XACT editor 633. When the designer has modified the design and the computer has revised the LCA file accordingly, the modified design will be reflected in the data stored in the means for storing data, and the logic array chip programmed from the revised data will reflect the designer's changes.

Although the invention has been described in detail in connection with a logic block array having two kinds of logic blocks shown in FIGS. 3a and 3b, other logic block arrays having multiple kinds of logic blocks or logic blocks having a wide variety of configurations can be programmed using the structure and method described here. Systems having multiple programmable chips, for example programmable logic array (PLA) chips, which can be connected to each other by manually or automatically connected lines rather than by switching on-chip transistors can also be programmed using the methods described here, with structural modification to accomplish off-chip connection. Fuse programmable and antifuse programmable devices can likewise be programmed with the method and structure of the present invention. Arrays of logic chips in which each chip represents a block in a logic array and interconnection is accomplished off-chip can also be programmed using the present methods. In such a case, a bit stream is generated for programming the logic into each chip, and an interconnect bit stream is generated for controlling off-chip interconnection, for example patterning a printed circuit board or controlling off-chip transistors.

The partitioning method described here may be used as well for partitioning logic between multiple printed circuit boards, or for partitioning logic among a plurality of semicustom chips or ASICs. It may also be used for partitioning numerical calculations between a plurality of programmable multiprocessors.

In light of the above disclosure, other embodiments of the present invention will become obvious to one of ordinary skill in the art.

We claim:

1. For configuring a logic array having logic blocks for implementing a logic design, a method for partitioning said logic design to be implemented by said logic array comprising the steps of:
   reading said logic design describing each logic gate and its connections to other logic gates;
   reading a partitioning specification indicating for at least some of said logic gates which logic gates are to be grouped together into a logic block;
   partitioning each of said logic gates to occupy one of a set of groups, each of said groups to be implemented in one of said logic blocks, such that said partitioning specification and schematic specification are met.

2. A method of partitioning as in claim 1 in which said step of automatically partitioning comprises first assigning to said groups those of said logic gates indicated in said partitioning specification to be grouped together.

3. A method of partitioning as in claim 2 in which said step of reading a partitioning specification comprises determining for said at least some of said logic gates output lines to be provided on at least some output ports of said logic blocks.

4. A method of partitioning as in claim 2 in which said step of reading a partitioning specification comprises determining for said at least some of said logic gates at least some input lines to be provided on at least some input ports of said logic blocks.

5. A method of partitioning as in claim 2 in which said step of reading a partitioning specification comprises determining for said at least some of said logic gates at least some input and output lines to be provided on at least some input and output ports of said logic blocks.

6. A method of partitioning as in claim 1 in which said step of reading a partitioning specification comprises receiving, in relation to a library partitioning symbol representing said logic block, indications of selected signal lines connecting selected logic gates in said logic design to be provided at selected ports of said logic block.

7. A method of partitioning as in claim 1 further comprising the step of recording a configuration of said blocks to implement said specification.

8. A method as in claim 1 further comprising the steps of:
   placing each of said groups into a particular one of said logic blocks; and
   routing said interconnect lines between said logic blocks, thereby causing said logic array to perform a function indicated by said logic design.

9. For configuring a logic array having logic blocks, each logic block for implementing at least one of a set of logic gates in a logic design, a method of partitioning comprising the steps of:
   reading a logic design from at least one source;
   grouping said logic design from said at least one source into logic to be performed by at least one logic block, thereby partitioning all of said logic design from one source of said at least one source to at least one logic block;
   repeating said grouping step for each of said at least one source; and
   merging all of said at least one group from all of said at least one source to form a merged set of groups of partitioned logic.

10. A method of partitioning as in claim 9 in which one of said groups is implemented by one of said logic blocks.

11. A method of partitioning as in claim 9 in which two of said groups are implemented by one of said logic blocks.

12. A method of partitioning as in claim 9 in which said step of grouping comprises for each of said at least one source
   first assigning to logic blocks those of said logic gates indicated in said partitioning specification as to be grouped together, and
   subsequently assigning those of said logic gates for which there is no indication in said partitioning specification.

13. A method of partitioning as in claim 9 in which said step of grouping said logic design comprises:
   reading said logic design describing each logic gate and its connections to other logic gates;
   reading a partitioning specification indicating for at least some of said logic gates which logic gates are to be grouped together into a logic block;
   partitioning each of said logic gates to occupy one of a set of groups, each of said groups to be implemented in one of said logic blocks, such that said partitioning specification and logic design are implemented.

14. A method of partitioning as in claim 13 in which said step of reading a partitioning specification comprises reading for said at least some of said logic gates output lines to be provided on at least some output ports of said logic blocks.

15. A method of partitioning as in claim 13 in which said step of reading a partitioning specification comprises determining for said at least some of said logic gates at least some input lines to be provided on at least some input ports of said logic blocks.

16. A method of partitioning as in claim 13 in which said step of reading a partitioning specification comprises determining for said at least some of said logic gates at least some input and output lines to be provided on at least some input and output ports of said logic blocks.

17. A method of partitioning as in claim 13 in which said step of reading a partitioning specification comprises receiving, in relation to a library partitioning symbol representing said logic block, indications of selected signal lines connecting selected logic gates in said logic design to be provided at selected ports of said logic block.

18. A method of partitioning as in claim 9 further comprising for each of said at least one source the step of recording a configuration of said blocks to implement said logic design.

19. A method as in claim 9 further comprising the steps of:
   placing each of said merged set of groups of partitioned logic into a particular one of said logic blocks; and
   routing said interconnect lines between said logic blocks, thereby causing said logic array to perform a function indicated by said logic design.

20. For configuring a logic array comprising a plurality of configurable logic blocks and a plurality of interconnect lines which can be programmably connected to said logic blocks, means for partitioning logic gates in a logic design into groups, each group to be performed in one of said logic blocks, comprising:
   a library of logic block symbols, each logic block symbol representing one logic block type and showing representations of at least some ports of said logic block type;

means for using said logic block symbols to indicate which of said logic gates will be grouped to be associated with one of said configurable logic blocks; and means for partitioning into groups all of said logic gates in said logic design including means for grouping said logic gates indicated to be associated with one of said configurable logic blocks.

21. Means for partitioning logic as in claim 20 further comprising means for storing descriptions of each of said groups.

22. Means for partitioning logic as in claim 20 in which said means for partitioning into groups all of said logic gates includes automatic means for partitioning those of said logic gates not indicated to be associated with one of said configurable logic blocks.

23. Means for partitioning logic as in claim 22 in which said automatic means for partitioning includes means for grouping those of said logic gates not already indicated as belonging to a group.

24. In a logic array comprising a plurality of configurable logic blocks and a plurality of interconnectable interconnect lines, structure for partitioning logic specified by a designer into logic units, each logic unit to be performed by one of said logic blocks comprising:

a library of logic symbols including one logic block symbol to represent one logic block type, said logic block symbol showing representations of at least some pods of said logic block type;

means for a designer to manually indicate logic to be associated with said at least some ports of said logic block type; and means for partitioning all of said logic including means for partitioning said logic specified by said designer to be associated with said at least some of said ports of said logic block type to said ports as indicated by said designer.

25. Structure for partitioning logic as in claim 24 in which said library contains two logic block symbols for two logic block types, comprising:

an input/output logic block type for receiving signals placed on external pins of said logic array and placing signals on said external pins of said logic array, and a configurable logic block type for receiving signals placed on said interconnect lines, performing a plurality of combinatorial logic functions, and placing signals on said interconnect lines.

26. In a logic array comprising configurable logic blocks and configurable interconnect lines for interconnecting said blocks, a method for partitioning a plurality of logic designs into groups to be implemented by said blocks comprising the steps of:

forming at least two files, at least a first file and a second file, said first file describing each function in a first logic design, and said second file describing each function in a second logic design;

partitioning said first logic design such that each said function in said first logic design occupies part of a group, thereby forming a first set of groups;

merging said second file with said first set of groups, thereby forming a merged file; and partitioning said merged file such that each said function in said second logic design occupies part of a group, thereby forming a single complete set of groups.

27. Method for partitioning a logic design as in claim 26 including the further steps of:

determining placement of each of said groups in one of said logic blocks;

determining which of said interconnect lines must be connected to each other and to said logic blocks to implement said plurality of logic designs; and programming interconnections between said interconnect lines, and configuring said configurable logic blocks to implement said plurality of logic designs.

28. Method for partitioning a logic design as in claim 26 including the step for each said group of recording a configuration of said logic blocks to implement each of said functions allocated to said groups.

29. A method for programming a logic array, said array comprising configurable logic blocks and configurable interconnect lines, comprising the steps of:

reading information about a new logic design;

reading information about a previously partitioned, placed, and routed logic design;

comparing said new logic design to said previously partitioned, placed, and routed logic design;

when a portion of said new logic design matches a portion of said previously partitioned placed and routed logic design, repeating for said new design that portion of said previously partitioned placed and routed logic design.

30. A method for programming a logic array as in claim 29 including a method for determining when a portion of said new logic design matches said previously partitioned placed and routed logic design comprising the steps of:

comparing names of named configurable logic blocks in said new design to names of named configurable logic blocks in said previously partitioned placed and routed logic design and determining a match has occurred when said names of said configurable logic blocks match; and comparing names of signal lines leading to unnamed logic blocks in said new design to names of signal lines leading to unnamed logic blocks in said previously partitioned placed and routed logic design and determining a match has occurred when said names of signal lines match.

31. A method for programming a logic array as in claim 29 in which said repeating for said new design that portion of said previously partitioned placed and routed logic design comprises repeating said placement and routing for all configurable logic blocks in which said names match.

32. A method of programming a logic array as in claim 31 in which said repeating further comprises repeating said placement and routing for all said non-configurable logic blocks in which said names of said signal lines match.

* * * * *

UNITED STATES PATENT AND TRADEMARK OFFICE
CERTIFICATE OF CORRECTION

PATENT NO. : 5,448,493

DATED : September 5, 1995

INVENTOR(S) : Christine M. Weir, et al

It is certified that error appears in the above-indentified patent and that said Letters Patent is hereby corrected as shown below:

Title page; "Topolewski et al." should read --Weir et al.--.

Title page; in Inventors, "Todd J. Topolewski, Oakland; Christine M. Weir, Santa Cruz; Bart" should read --Christine M. Weir, Santa Cruz; Todd J. Topolewski, Oakland; Bart--.

Title page; in Other Publications, " "An Efficient Heuristic Procedure for Partitioning Graphs" by Kernigham et al." should read --"An Efficient Heuristic Procedure for Partitioning Graphs" by Kernighan et al.--.

Title page; in Other Publications, " "Design with Logic Cell Arrays" " should read --"Designing with Logic Cell Arrays"--.

Col. 6, line 2, "or1_out, or2_out" should read --or1_out, or2_out--.

Col. 6, line 22, "clk_out," should read --clkout,--.

Col. 6, line 29, "PIN, O, O or2_out," should read --PIN, O, $\overline{O}$, or2_out--.

Col. 9, line 42, "Editblk Pq" should read --Editblk P9--.

Col. 10, line 43, "available Jiri" should read --available. Jiri--.

UNITED STATES PATENT AND TRADEMARK OFFICE
CERTIFICATE OF CORRECTION

PATENT NO. : 5,448,493
DATED : September 5, 1995
INVENTOR(S) : Christine M. Weir, et al It is certified that error appears in the above-indentified patent and that said Letters Patent is hereby corrected as shown below:

Col. 16, in Table 5, many occurrences of "()" should be noted to read --()-- beginning and ending parentheses with no argument in between.

Col. 16, in Table 5 (where the table title is counted as line 1), line 34, "(ASSIGNDGRPSo)" should read --(ASSIGNDGRPS ())--.

Col. 16, in Table 5 (where the table title is counted as line 1), line 36, "symbol TABLE and signal TABLE" should read --symbol table and signal table--.

Col. 16, in Table 5 (where the table title is counted as line 1), line 38, "INITSYMBLO" should read --INITSYMBL ()--.

Col. 18, in Table 4, "5  CPG" should read --5  CFG--.

Col. 19, in Table 4, "21  PIN, O, 6" should read --21  PIN, O, $\overline{O}$--.

Col. 19, line 30, " "SYM" indicating" should read --"SYM", indicating--.

Col. 19, line 31, "scribed  The" should read --scribed.  The--.

UNITED STATES PATENT AND TRADEMARK OFFICE
CERTIFICATE OF CORRECTION

PATENT NO. : 5,448,493
DATED : September 5, 1995
INVENTOR(S) : Christine M. Weir, et al It is certified that error appears in the above-indentified patent and that said Letters Patent is hereby corrected as shown below:

Col. 27, Claim 24, line 32, "pods" should read --ports--.

Signed and Sealed this

Second Day of July, 1996

Attest:

BRUCE LEHMAN

Attesting Officer

Commissioner of Patents and Trademarks